US010626914B2

(12) United States Patent
Nishinakama

(10) Patent No.: US 10,626,914 B2
(45) Date of Patent: Apr. 21, 2020

(54) SPHERICAL BEARING DEVICE AND SWITCH

(71) Applicant: Panasonic Intellectual Property Management Co., Ltd., Osaka (JP)

(72) Inventor: Hideki Nishinakama, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 491 days.

(21) Appl. No.: 15/654,038

(22) Filed: Jul. 19, 2017

(65) Prior Publication Data
US 2017/0314610 A1    Nov. 2, 2017

Related U.S. Application Data

(63) Continuation of application No. PCT/JP2016/004621, filed on Oct. 19, 2016.

(30) Foreign Application Priority Data

Dec. 2, 2015  (JP) ................................. 2015-235923

(51) Int. Cl.
*F16C 11/06* (2006.01)
*H01H 25/04* (2006.01)
(Continued)

(52) U.S. Cl.
CPC ...... *F16C 11/0614* (2013.01); *F16C 11/0604* (2013.01); *H01H 25/04* (2013.01);
(Continued)

(58) Field of Classification Search
CPC ... F16C 11/06; F16C 11/0604; F16C 11/0614; F16C 11/0661; F16C 11/069;
(Continued)

(56) References Cited

U.S. PATENT DOCUMENTS 3,090,642 A * 5/1963 Gottschald .......... F16C 11/0604
                                              403/135
3,679,846 A * 7/1972 Dillon .................... H01H 25/04
                                              200/6 A (Continued)

FOREIGN PATENT DOCUMENTS

JP          3107440 U    2/2005
JP       2012-172764    9/2012

OTHER PUBLICATIONS

International Search Report of PCT application No. PCT/JP2016/004621 dated Jan. 24, 2017.

*Primary Examiner* — Josh Skroupa
(74) *Attorney, Agent, or Firm* — Greenblum & Bernstein, P.L.C.

(57) ABSTRACT

A spherical bearing device includes a shaft member, a turnable body, and a bearing. The shaft member has a shaft body and a spherical body having a first engaging portion. The turnable body has a second engaging portion that is engaged with the first engaging portion in a first rotational direction about a first axis passing through a center of the spherical body, and allows other rotations. The bearing is provided with a first space and a second space. The first space accommodates the spherical body spherically slidably. The second space accommodates the turnable body such that the turnable body is turnable, and allows the shaft body to move.

6 Claims, 28 Drawing Sheets

(51) Int. Cl.
*H03K 17/97* (2006.01)
*H01H 89/00* (2006.01)

(52) U.S. Cl.
CPC ....... *H03K 17/97* (2013.01); *H01H 2089/005* (2013.01); *H03K 2217/94068* (2013.01); *H03K 2217/96015* (2013.01); *Y10T 403/32737* (2015.01)

(58) Field of Classification Search
CPC .............. F16C 11/0695; H01H 25/04; H01H 2089/005; H03K 17/97; H03K 2217/64068; H03K 2217/96015; Y10T 403/32196; Y10T 403/32631; Y10T 403/32737; Y10T 403/32786; Y10T 403/32803
USPC ........................... 403/76, 122, 135, 141, 143
See application file for complete search history.

(56) References Cited

U.S. PATENT DOCUMENTS

| | | | |
|---|---|---|---|
| 3,850,047 A | 11/1974 | Davis | |
| 4,333,360 A | 6/1982 | Simmons | |
| 7,007,901 B2 * | 3/2006 | Kondo | F16M 11/14 403/122 |
| 9,464,663 B2 * | 10/2016 | Belleau | F16C 11/0623 |
| 9,831,819 B2 * | 11/2017 | Kirk | H02S 20/32 |

* cited by examiner

SPHERICAL BEARING DEVICE AND SWITCH

CROSS-REFERENCE TO RELATED APPLICATIONS

This application is a continuation of the PCT International Application No. PCT/JP2016/004621 filed on Oct. 19, 2016, which claims the benefit of foreign priority of Japanese patent application No. 2015-235923 filed on Dec. 2, 2015, the contents all of which are incorporated herein by reference.

BACKGROUND

1. Technical Field

The present disclosure relates to a spherical bearing device capable of restricting rotation about any one axis, and a switch including the spherical bearing device.

2. Description of the Related Art

The spherical bearing device allows a shaft member to freely move in an X-direction and a Y-direction perpendicular to the X-direction with respect to a bearing, and further allows the shaft member to rotate about a center axis of the shaft member. In addition, the spherical bearing device can also be miniaturized, advantageously.

As such a spherical bearing device, the spherical bearing device described in Unexamined Japanese Patent Publication No. 2012-172764 is known, for example. Unexamined Japanese Patent Publication No. 2012-172764 discloses the spherical bearing device that can reduce frictional resistance while preventing a shaft member from rattling with respect to a bearing, and secure a comparatively large allowable tilt angle of the shaft member.

SUMMARY

On the other hand, although having such an advantage that the shaft member has a lot of degrees of freedom in movement with respect to the bearing, the spherical bearing device may have a requirement for restricting one of the degrees of freedom.

In such a case, the requirement complicates the structure and increases the number of components, thereby causing difficulty in manufacturing, for example, like the spherical bearing device disclosed in Japanese Registered Utility Model No. 3107440. This makes it difficult to obtain the above advantage, i.e., simple structure and possible miniaturization.

The present disclosure, which is made in view of the above-mentioned problem of the conventional spherical bearing devices, aims to provide a spherical bearing device that can restrict a degree of freedom in movement of a shaft member with a simple structure without limiting the possibilities of miniaturization, and a switch including the same.

To achieve the above-mentioned aim, the spherical bearing device in accordance with the present disclosure includes a shaft member, a turnable body, and a bearing. The shaft member has a spherical body having a first engaging portion, and a shaft body disposed with an axis passing through a center of the spherical body. The turnable body has a second engaging portion. The second engaging portion is engaged with the first engaging portion in a first rotational direction about a first axis passing through the center of the spherical body, and allows the first engaging portion to rotate in a second rotational direction about a second axis intersecting with the first axis at the center. The bearing is provided with a first space and a second space, holds the shaft member so as to be spherically slidable, and allows the shaft body to move as the spherical body slides spherically. The first space accommodates the spherical body such that the spherical body is spherically slidable about the center of the spherical body, and the second space accommodates the turnable body of which the second engaging portion is engaged with the first engaging portion such that the turnable body is rotatable about a third axis intersecting with the first and second axes at the center.

In the spherical bearing device in accordance with the present disclosure, the spherical body of the shaft member is accommodated in the first space of the bearing, and the turnable body is accommodated in the second space, which is communicated with the first space. The turnable body turns with the spherical body about the third axis intersecting with the first axis, in the state where the spherical body is restricted to rotate about the first axis by the turnable body.

Thus, a degree of freedom of the shaft member can be restricted with respect to a bearing with a simple structure, and therefore a small-sized spherical bearing device can be provided.

DETAILED DESCRIPTION OF PREFERRED EMBODIMENTS

Figure 1:
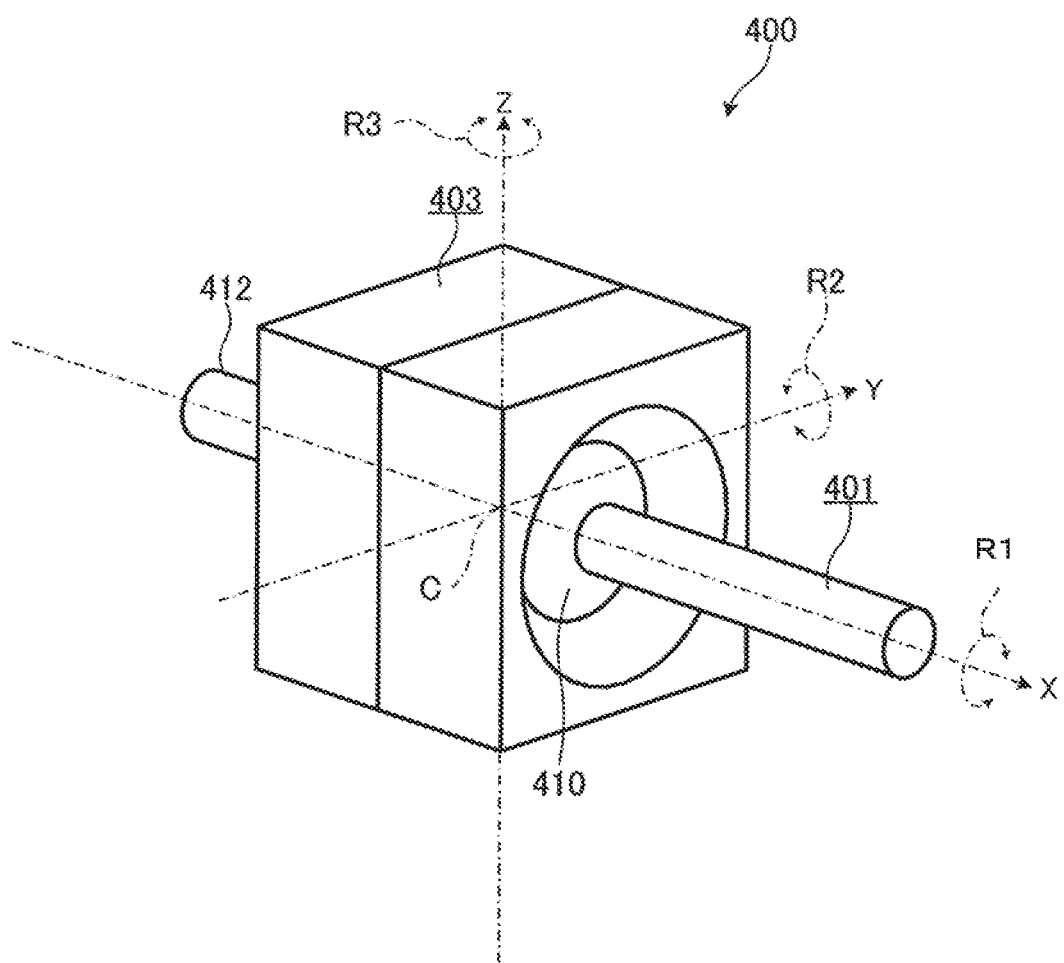
FIG. 1 is a perspective view showing appearance of a spherical bearing device in accordance with a first exemplary embodiment.

Exemplary embodiments of a spherical bearing device and a switch in accordance with the present disclosure will be described with reference to the drawings. Note that, the following exemplary embodiments merely show examples of the spherical bearing device and the switch in accordance with the present disclosure. Accordingly, the scope of the present disclosure is literally defined by claim language with reference to the following exemplary embodiments, but is not limited to only the following exemplary embodiments. Thus, among the structural elements in the following exemplary embodiments, structural elements not recited in any one of the independent claims, representing the most generic concepts of the present disclosure, are described as arbitrary structural elements of a more preferable embodiment, although not necessarily required to attain the subject of the present disclosure.

Besides, to show the present disclosure, the drawing serves as a schematic view in which emphasis, abbreviation, and adjustment of proportion are performed, if necessary. Thus, the drawing may be different in actual form, spatial relationship, or proportion.

First Exemplary Embodiment

FIG. 1 is a perspective view showing appearance of a spherical bearing device in accordance with a first exemplary embodiment.

Figure 2:
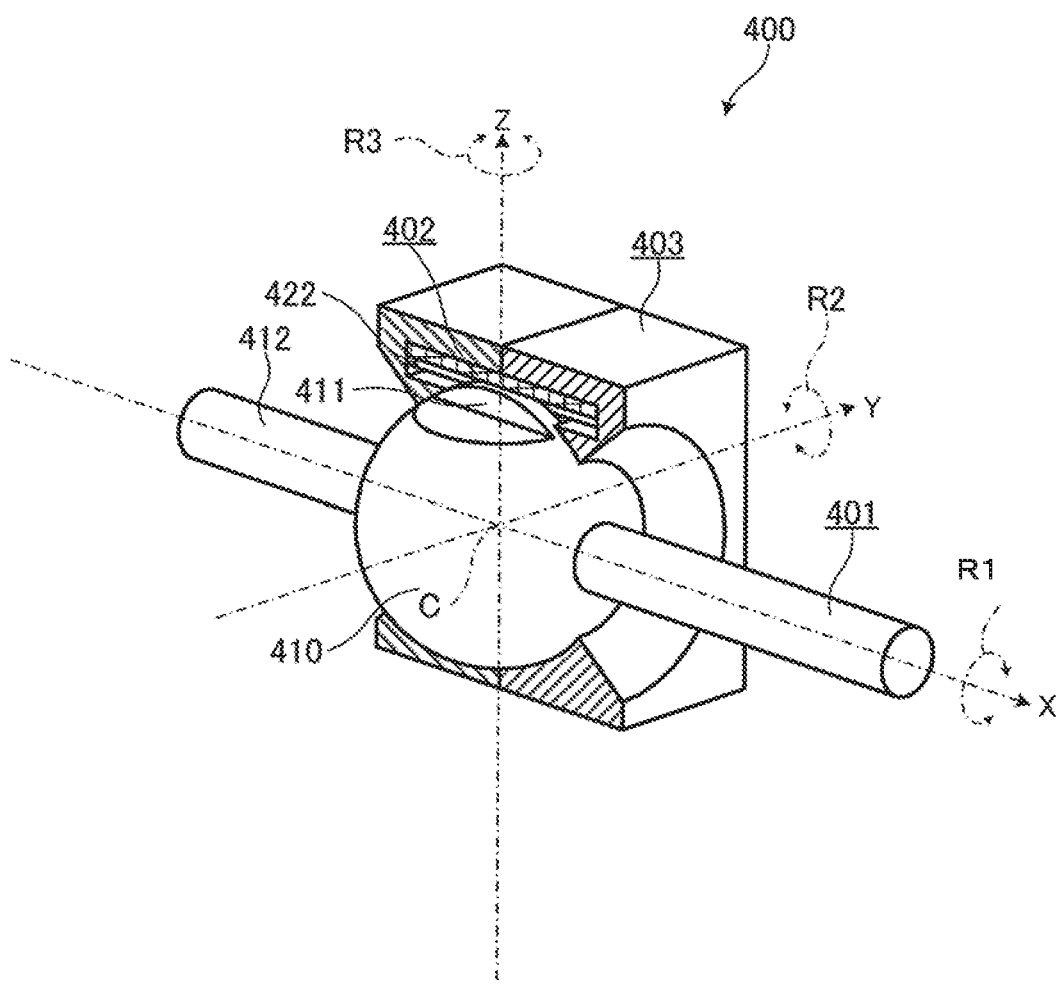
FIG. 2 is a perspective view of the spherical bearing device in which a bearing and a turnable body are cut out.

FIG. 2 is a perspective view of the spherical bearing device in which a bearing and a turnable body are cut out.

Figure 3:
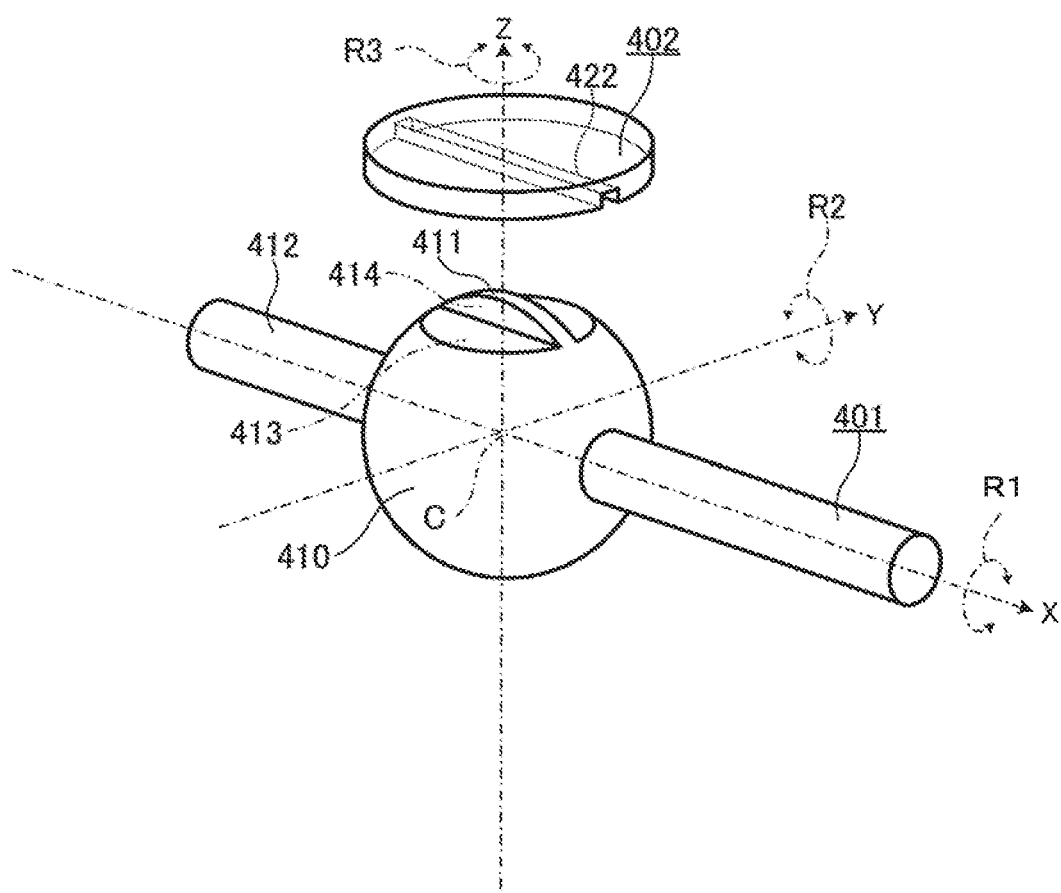
FIG. 3 is an exploded perspective view of a shaft member and the turnable body where the bearing is omitted.

FIG. 3 is an exploded perspective view of a shaft member and the turnable body when the bearing is omitted.

As shown in these views, spherical bearing device 400 includes shaft member 401, turnable body 402, and bearing 403.

Shaft member 401 serves as a moving part that moves in the state where any one of three kinds of degrees of freedom is restricted with respect to bearing 403. Shaft member 401 includes spherical body 410 having first engaging portion 411 for restricting one degree of freedom in movement of shaft member 401, and shaft body 412 to be attached to spherical body 410. In the case of the present exemplary embodiment, shaft body 412 is disposed such that the center axis thereof passes through center C of spherical body 410. Further, shaft body 412 is attached to spherical body 410 so as to pass through spherical body 410. In other words, shaft body 412 is attached to spherical body 410 so as to project from both sides of spherical body 410 and extend in opposite directions to each other along the same center axis line.

First engaging portion 411 is a part of spherical body 410 and is formed in a surface portion of spherical body 410 having a spherical shape. In the case of the present exemplary embodiment, first engaging portion 411 is a part of spherical body 410, and is formed such that spherical body 410 having the spherical shape is partially cut out (recessed). As shown in FIG. 3, first engaging portion 411 is a part that is formed into a substantially partial disk-like shape. First engaging portion 411 is formed such that spherical body 410 is partially cut out by first surface 413 and second surface 414, and is further cut out to form a portion plane-symmetrical to the above cutout portion with respect to X-Z plane. First surface 413 is perpendicular to Z-axis passing through center C of spherical body 410, and second surface 414 is parallel to X-Z plane that includes Z-axis, and X-axis intersecting with Z-axis at center C. Besides, spherical body 410 and shaft body 412 are formed integrally.

Turnable body 402 is a member for restricting one degree of freedom, in which spherical body 410 spherically slides with respect to bearing 403. Turnable body 402 is also a member that has a rotating body shape and includes second engaging portion 411 to be engaged with first engaging portion 422. Herein, the rotating body shape is a three-dimensional shape obtained by rotating a straight line or a curved line about one axis, such as a disk, a pillar, or a cone.

In the case of the present exemplary embodiment, turnable body 402 has a disk-like shape, and is engaged with first engaging portion 411 of spherical body 410. Thus, turnable body 402 follows the rotation (turn) of shaft member 401 about a third axis (Z-axis in the view), and then rotates (turns) in third rotational direction R3. In other words, turnable body 402 is disposed, with respect to bearing 403, such that a center axis of turnable body 402 agrees with the third axis.

Second engaging portion 422 is a portion of turnable body 402 that is formed in the rotating body-shaped member. In the case of the present exemplary embodiment, second engaging portion 422 is a portion formed such that a surface of turnable body 402 is partially cut out (recessed). Further, second engaging portion 422 is engaged with first engaging portion 411 to restrict the rotation of shaft member 401 in first rotational direction R1 about a first axis (X-axis in the view) passing through center C of spherical body 410 with respect to bearing 403. Second engaging portion 422 allows first engaging portion 411 to rotate (turn) in second rotational direction R2 about a second axis (Y-axis in the view) intersecting with a first axis (X-axis in the view) at center C, thus allows shaft member 401 to rotate (turn) in second rotational direction R2.

In the case of the present exemplary embodiment, second engaging portion 422 is a groove provided in a surface of turnable body 402, as shown in FIG. 3, and second engaging portion 422 has a width enough for inserting first engaging portion 411 thereinto. Further, groove-shaped second engaging portion 422 is disposed to intersect with a center axis (Z-axis in the view) of turnable body 402 and extends along the first axis (X-axis in the view).

Note that, groove-shaped second engaging portion 422 may be opened or closed at both ends.

Figure 4:
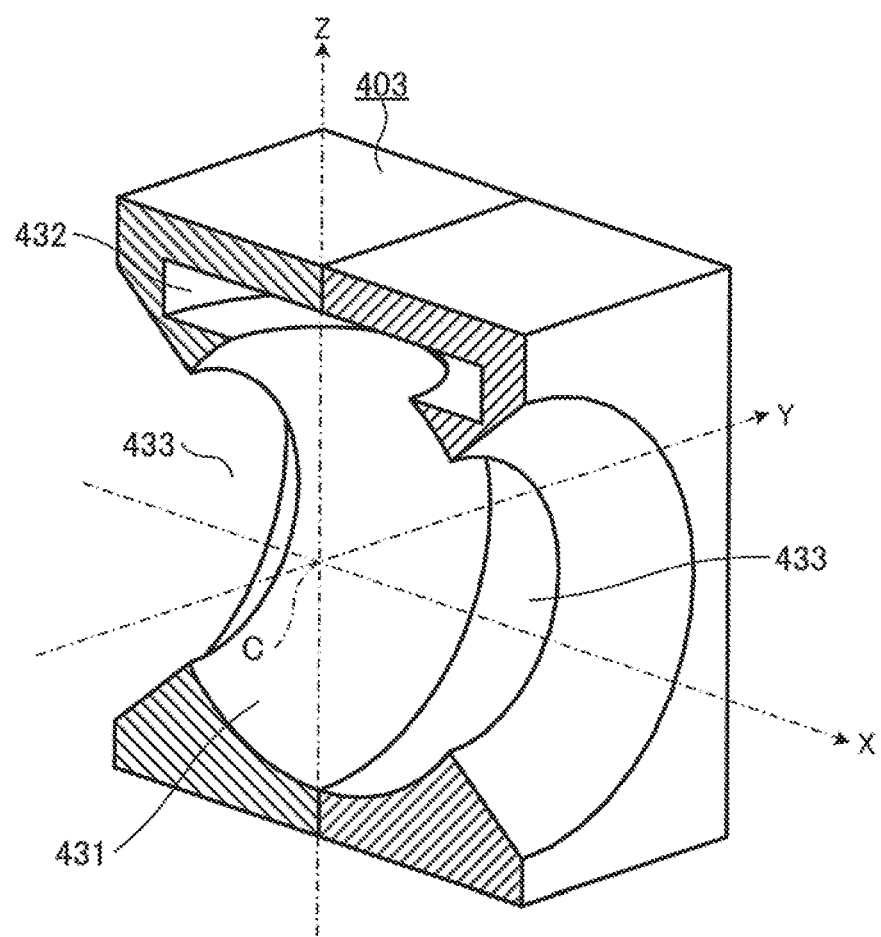
FIG. 4 is a perspective view showing the bearing that is partially cut out.

FIG. 4 is a perspective view of the bearing that is partially cut out.

As shown in FIGS. 1 to 4, bearing 403 is a member that holds spherical body 410 and turnable body 402. Spherical body 410 is accommodated inside bearing 403 such that spherical body 410 is spherically slidable. Turnable body 402 is rotatable in the state where second engaging portion 422 is engaged with first engaging portion 411. Bearing 403 includes substantially spherical shaped first space 431. The center of first space 431 is aligned with center C of spherical body 410. Further, bearing 403 includes second space 432 that has a substantially disk-like shape and accommodates turnable body 402. Second engaging portion 422 of turnable body 402 is engaged with first engaging portion 411 of spherical body 410 such that turnable body 402 is rotatable (turnable) about a third axis (Z-axis in the view). The third axis intersects with the first axis (X-axis in the view) and the second axis (Y-axis in the view) at center C. First space 431 and second space 432 are communicated with each other.

Besides, in the case of the present exemplary embodiment, bearing 403 includes through parts 433 that allow shaft body 412 to move as spherical body 410 slides spherically. Each of through parts 433 has a truncated cone shape that is disposed such that first space 431 is communicated with outer space and expands outwardly in the radial direction, thereby allowing shaft body 412 to tilt over a wide range. Further, through parts 433 are formed on both sides of bearing 403 because shaft body 412 is projected from both sides of bearing 403 along X-axis. Furthermore, bearing 403 is divided into two parts in order to put spherical body 410 and turnable body 402 therein. The two parts are joined integrally with a bolt (not shown).

Note that, first space 431 may have not only a spherical shape, which follows an external shape of spherical body 410, but also any other shapes such as a rectangular shape and a cylindrical shape, which are circumscribed on spherical body 410.

According to spherical bearing device 400 mentioned above, among three kinds of degrees of freedom in movement of shaft member 401 with respect to bearing 403, one degree of freedom can be restricted with a simple structure. Further, spherical bearing device 400 of which one degree of freedom is thus restricted can easily be miniaturized.

Second Exemplary Embodiment

Subsequently, switch 500 including spherical bearing device 400 will be described as a second exemplary embodiment. Note that, the same reference numerals are assigned to the same objects (portions), which have the same action and function, or the same shape, mechanism, and structure as in the first exemplary embodiment mentioned above, and the description thereof may be omitted. Further, in the following, a different point from the first exemplary embodiment will mainly be described, and description about the same contents may be omitted.

Figure 5:
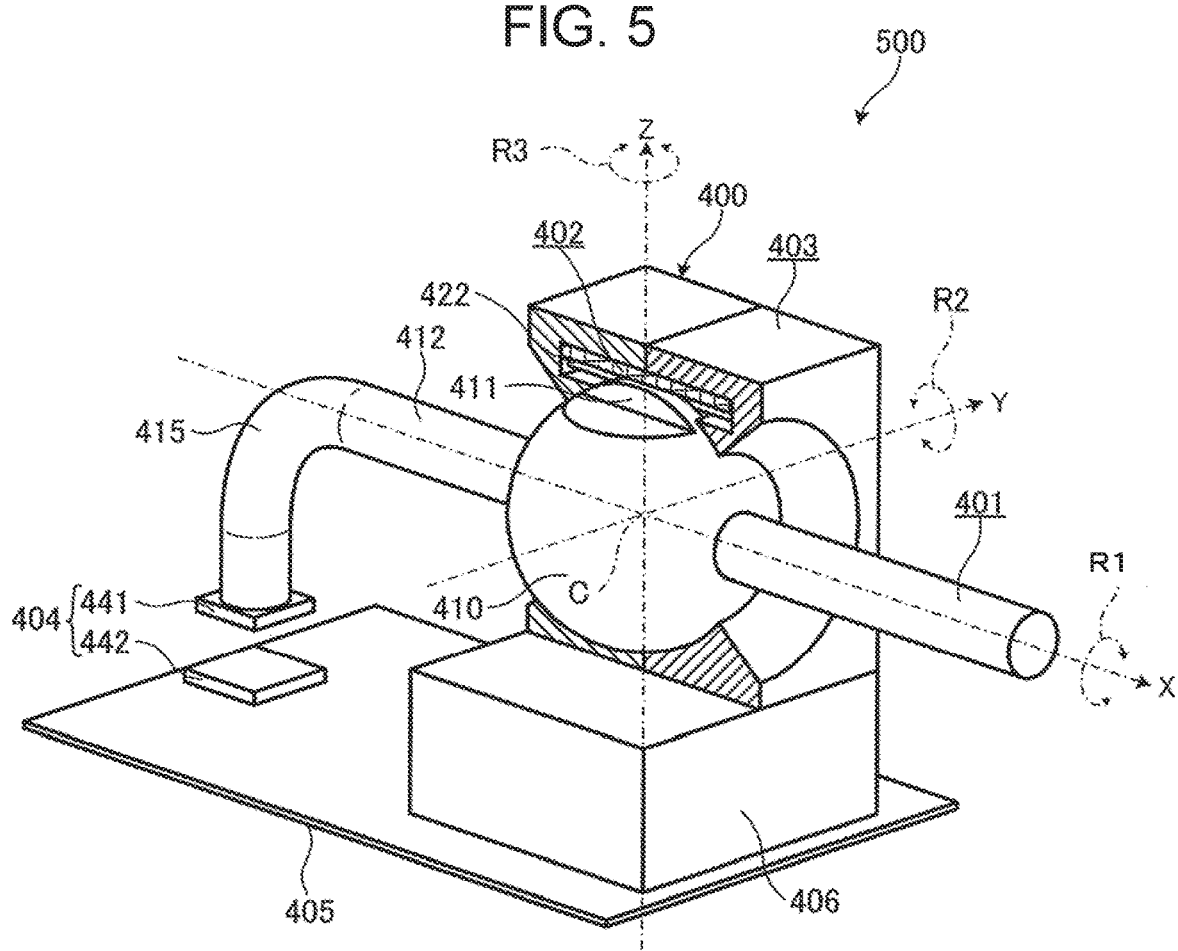
FIG. 5 is a perspective view showing a switch in accordance with a second exemplary embodiment, where a bearing and a turnable body are cut out.

FIG. 5 is a perspective view of switch 500 in accordance with the second exemplary embodiment, in which the bearing and the turnable body are cut out.

Switch 500 is a device that outputs an operation signal indicating movement of shaft member 401 based on movement of shaft member 401 with respect to bearing 403 of spherical bearing device 400. Switch 500 includes spherical bearing device 400, sensor 404, board 405, and spacer 406.

As shown in the figure, a center axis of shaft body 412 of spherical bearing device 400 is aligned with a first axis (X-axis in the view) in first rotational direction R1, where the rotation thereof is restricted. Further, shaft body 412 has bending portion 415. Accordingly, a posture (in the case of the present exemplary embodiment, bending portion 415 is disposed in X-Z plane and its tip end is directed downward) of bending portion 415 with respect to bearing 403 is maintained even when shaft member 401 is moved.

Sensor 404 has a first component attached to shaft member 401 of spherical bearing device 400, and a second component attached to board 405. Sensor 404 is a device that outputs an operation signal corresponding to a positional relationship between the first component and the second component.

In the case of the present exemplary embodiment, first component 441 is a permanent magnet, and second component 442 is a magnetic sensor.

Second component 442 is mounted on board 405, and board 405 is attached to bearing 403 via spacer 406.

Next, an operation of switch 500 will be described.

Figure 6:
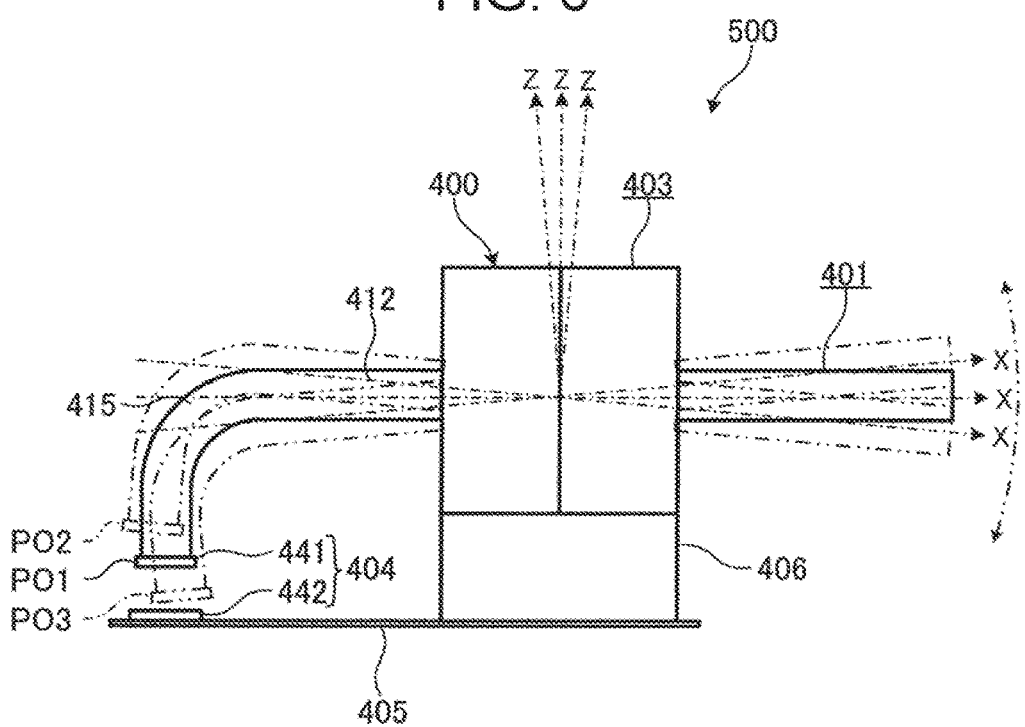
FIG. 6 is a side view of the switch, showing various positions of a first component when a shaft member of the spherical bearing device is rotated in a second rotational direction about a second axis.

FIG. 6 is a side view of the switch, and shows positions of first component 441 when the shaft member of the spherical bearing device is turned in a second rotational direction about a second axis.

Figure 7:
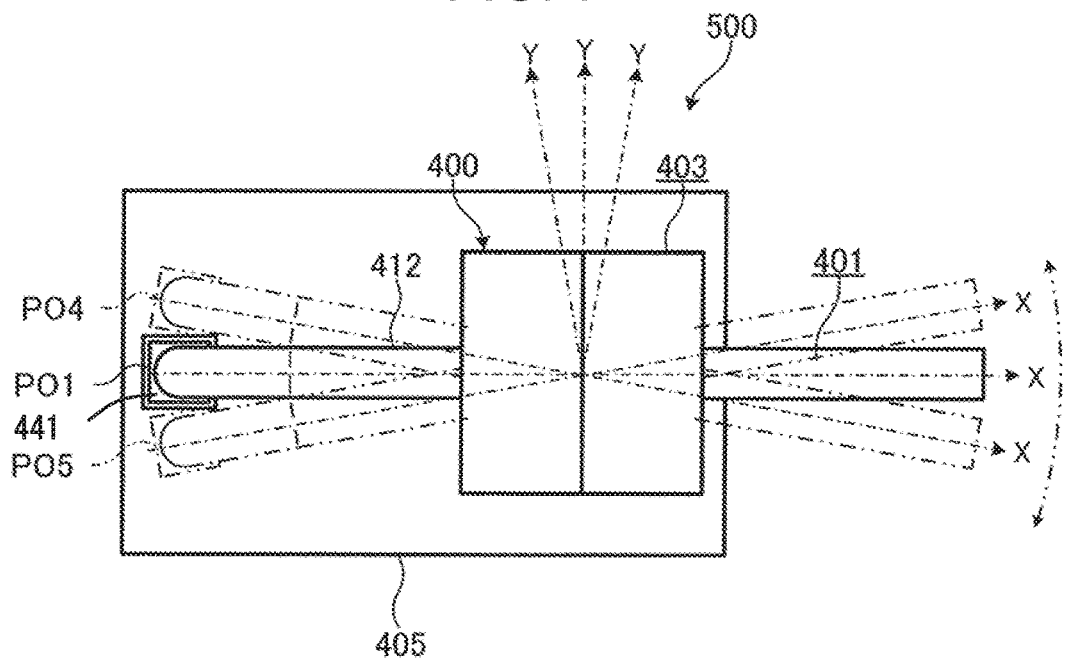
FIG. 7 is a top view of the switch, showing various positions of the first component when the shaft member of the spherical bearing device is rotated in a third rotational direction about a third axis.

FIG. 7 is a top view of the switch, and shows positions of first component 441 when the shaft member of the spherical bearing device is turned in a third rotational direction about a third axis.

As shown in FIGS. 6 and 7, in switch 500, second component 442 detects position PO1 that is a position of first component 441 with respect to second component 442, and outputs an operation signal indicating position PO1. Next, in FIG. 6, when shaft member 401 is rocked in a vertical plane and first component 441 is raised from position PO1 to position PO2, second component 442 outputs an operation signal indicating position PO2. Conversely, when first component 441 is dropped from position PO1 to position PO3, second component 442 outputs an operation signal indicating position PO3. Further, in FIG. 7, when shaft member 401 is rocked in a horizontal plane and first component 441 is moved from position PO1 to position PO4, second component 442 outputs an operation signal indicating position PO4. Conversely, when first component 441 is moved from position PO1 to position PO5, second component 442 outputs an operation signal indicating position PO5. The movement signals indicating position PO1, position PO2, position PO3, position PO4, and position PO5 are signals discriminable from one another. Switch 500 can output signals indicating at least five states based on those operation signals.

Further, shaft member 401 of spherical bearing device 400 is restricted to rotate or turn in first rotational direction R1 about the first axis (X-axis in the view). As shown in FIGS. 6 and 7, the above rotation is restricted without depending on a position (inclination) of the second axis (Y-axis in the view) or the third axis (Z-axis in the view). Accordingly, even if first component 441 is attached at a tip end of bending portion 415, and/or even if shaft member 401 takes any posture when the position of first component 441 is changed to any one of positions PO1 to PO5, the rotation (turn) of shaft member 401 in first rotational direction R1 is restricted. This makes it possible to avoid first component 441 from deviating from second component 442 largely.

With the above configuration, even if bending portion 415 is bended one or more times, first component 441 is attached at a tip end of such bending portion 415, and first component 441 and second component 442 are not arranged on the first axis line, the positional relationship between first component 441 and second component 442 is located within a predetermined region, because one degree of freedom in movement of shaft member 401 of spherical bearing device 400 is restricted. Accordingly, flexibility of selecting attachment positions of first component 441 and second component 442 is enhanced, thereby making it more flexible to design a structure of the device using switch 500.

Note that, the present disclosure is not limited to the above-mentioned exemplary embodiment. For instance, structural elements described in the present description may be combined optionally, or some structural elements may be excluded to make another exemplary embodiment as an exemplary embodiment of the present disclosure. Further, various modifications to the above-mentioned exemplary embodiments which may be conceived by those skilled in the art are to be included within the scope of the present disclosure, as long as such modifications do not depart from the essence of the present disclosure, i.e., the scope defined by terms recited in claims.

Figure 8:
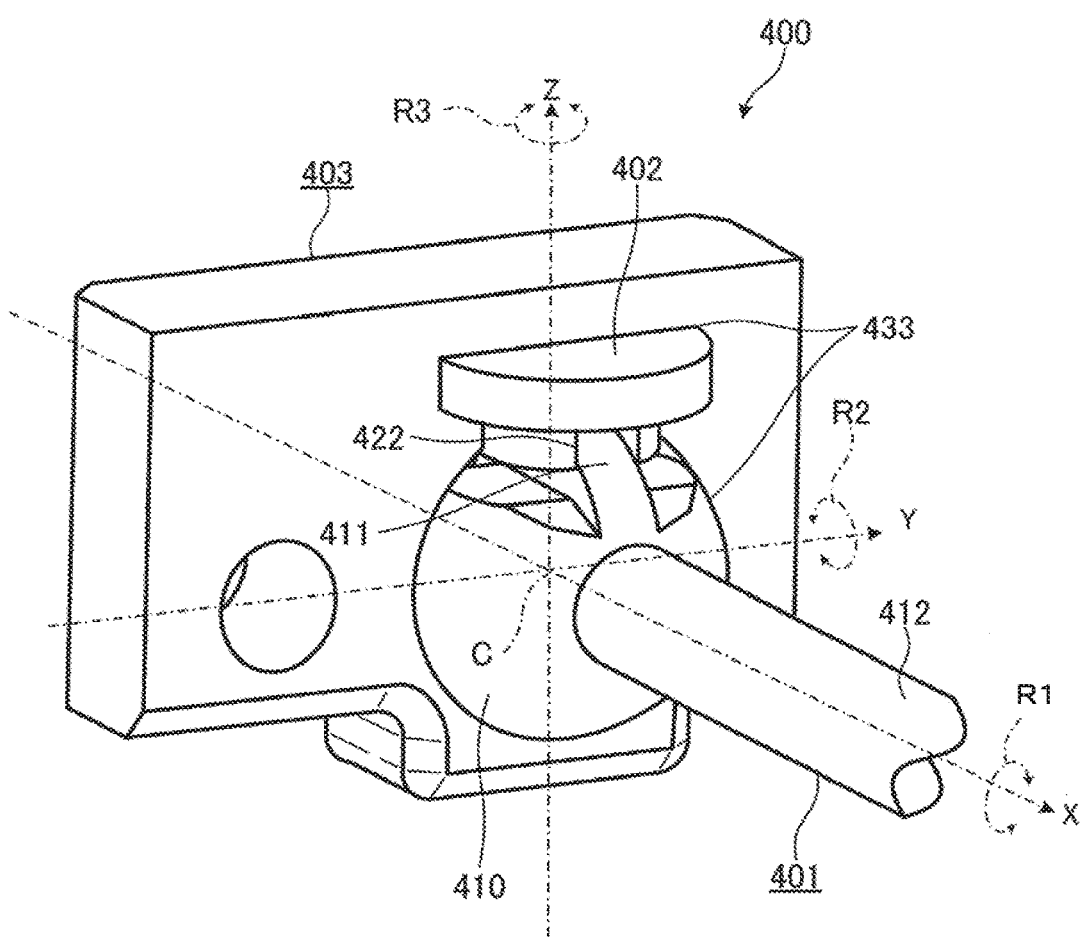
FIG. 8 is a perspective view showing appearance of a spherical bearing device in a modification.
Figure 9:
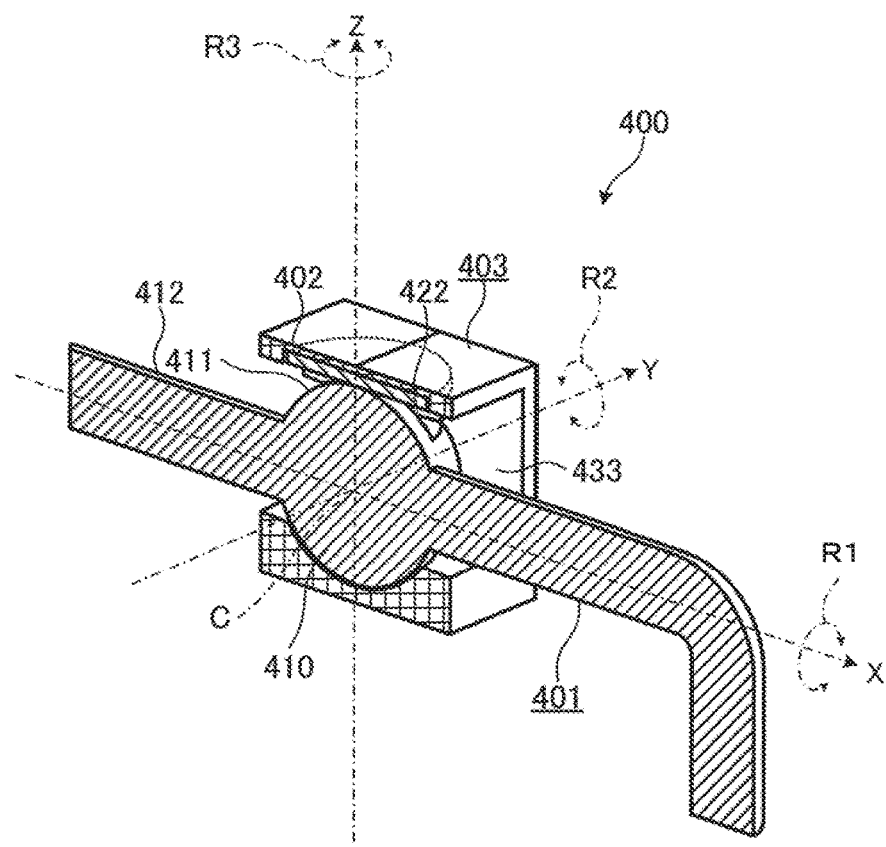
FIG. 9 is a perspective view showing a cross-section of a spherical bearing device in another modification.

For instance, the first space is communicated with outer space by through parts 433, but is not limited to this. As shown in FIGS. 8 and 9, in the case where the first space and the second space are communicated with the outer space directly, an opening part of bearing 403 may correspond to through-part 433. Further, not only shaft body 412 but spherical body 410 may pass through through-part 433. Furthermore, through-part 433 may have a rectangular shape.

Still further, turnable body 402 is not limited to a disk-like shape. A circular cylindrical shape or combination of two or more rotating bodies as shown in FIG. 8 may be employed.

Figure 10:
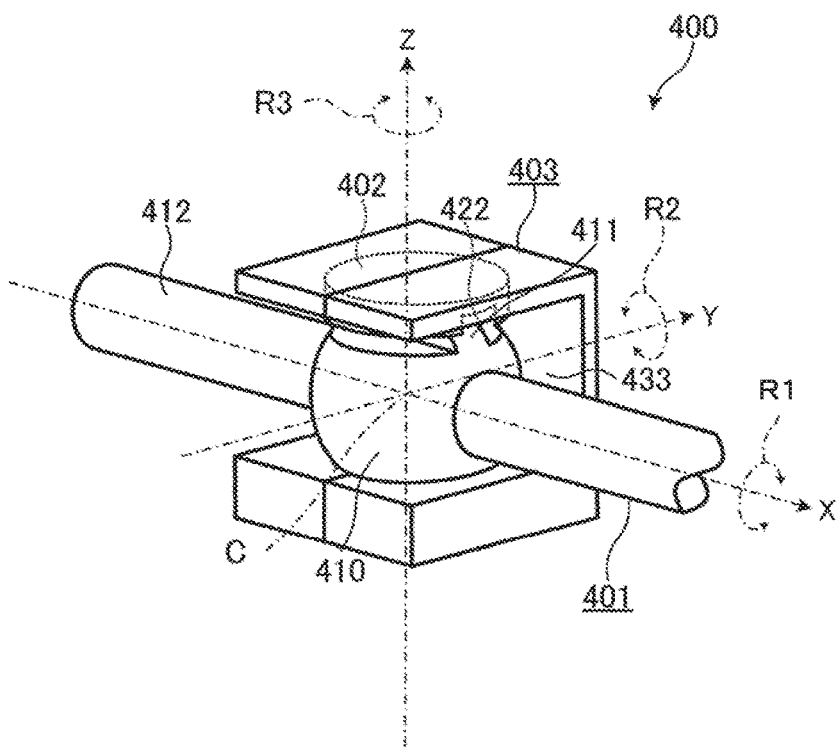
FIG. 10 is a perspective view showing appearance of a spherical bearing device in another modification.

Still furthermore, through-part 433 is not limited to a hole formed in bearing 403. As shown in FIG. 10, partially cutout bearing 403 may be employed such that it includes a portion corresponding to through-part 433.

Figure 11:
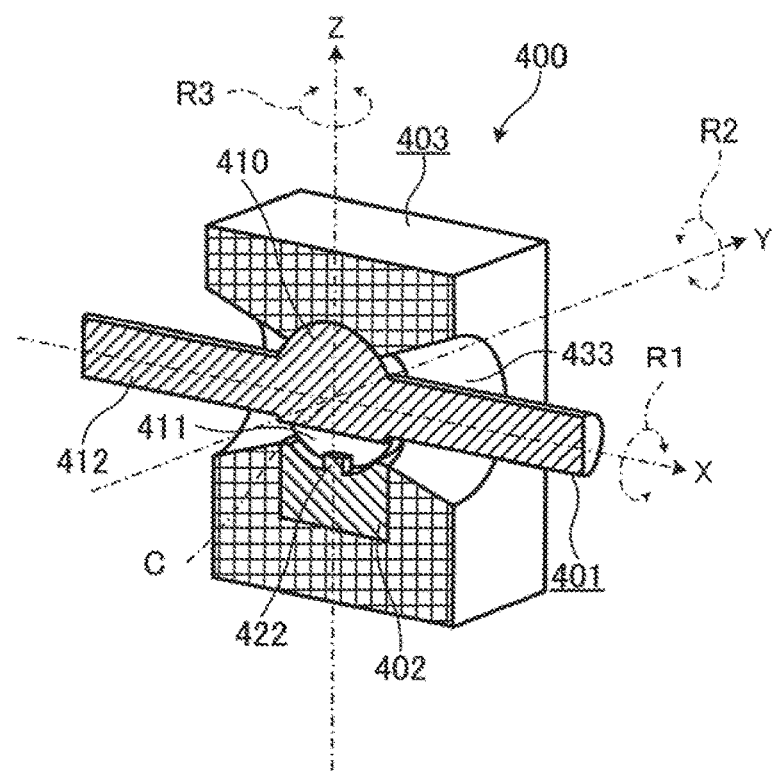
FIG. 11 is a perspective view showing a cross section of a spherical bearing device in another modification.
Figure 12:
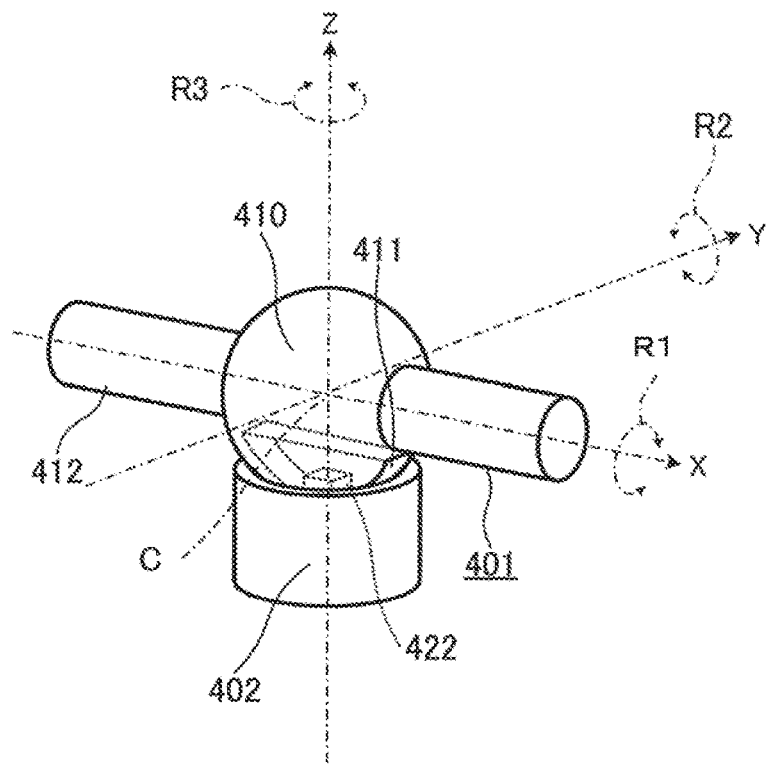
FIG. 12 is a perspective view showing a turnable body and a shaft member of the spherical bearing device shown in FIG. 11.

Further, as shown in FIGS. 11 and 12, a groove formed in spherical body 410 may be employed as first engaging portion 411, and a rectangular column-shaped projection, which is to be engaged with first engaging portion 411, may be employed as second engaging portion 422. Furthermore, turnable body 402 may have a spherical surface that is recessed to follow an external shape of spherical body 410.

Figure 13:
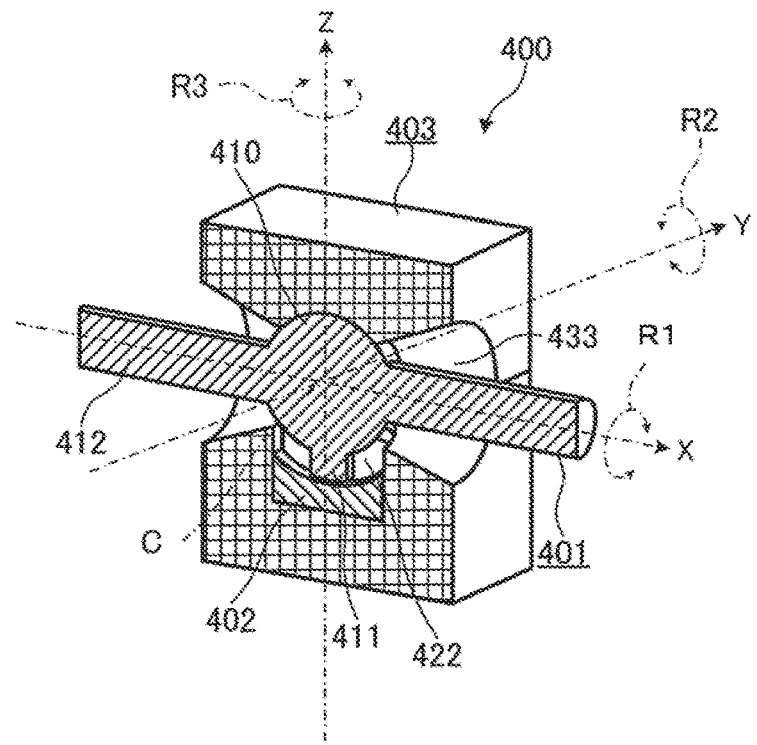
FIG. 13 is a perspective view showing a cross section of a spherical bearing device in another modification.
Figure 14:
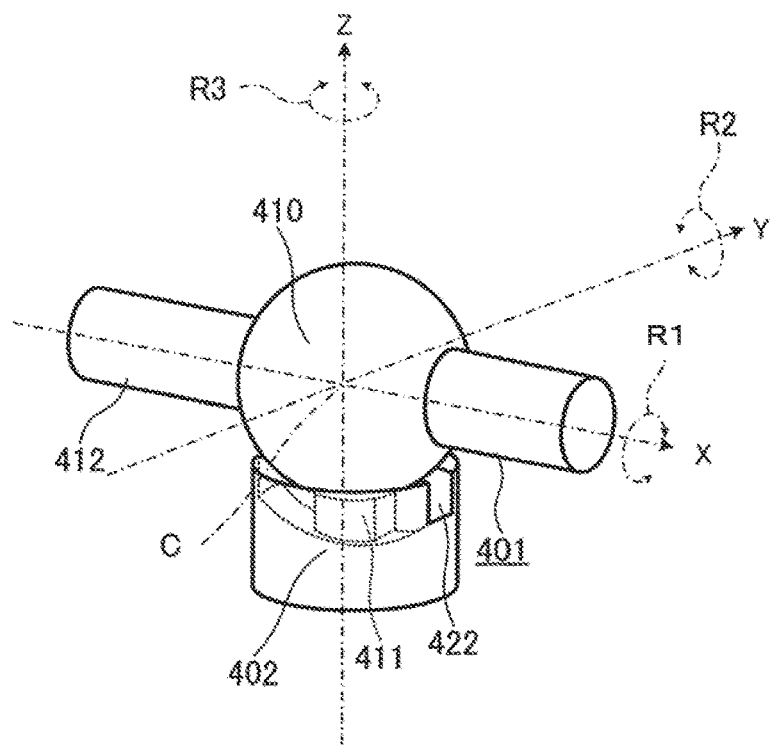
FIG. 14 is a perspective view showing a turnable body and a shaft member of the spherical bearing device shown in FIG. 13.

Still further, as shown in FIGS. 13 and 14, a rectangular column-shaped projection projected from spherical body 410 may be employed as first engaging portion 411, and a groove with which first engaging portion 411 is to be engaged may be employed as second engaging portion 422. Still furthermore, turnable body 402 may have a spherical surface that is recessed to follow an external shape of spherical body 410.

Figure 15:
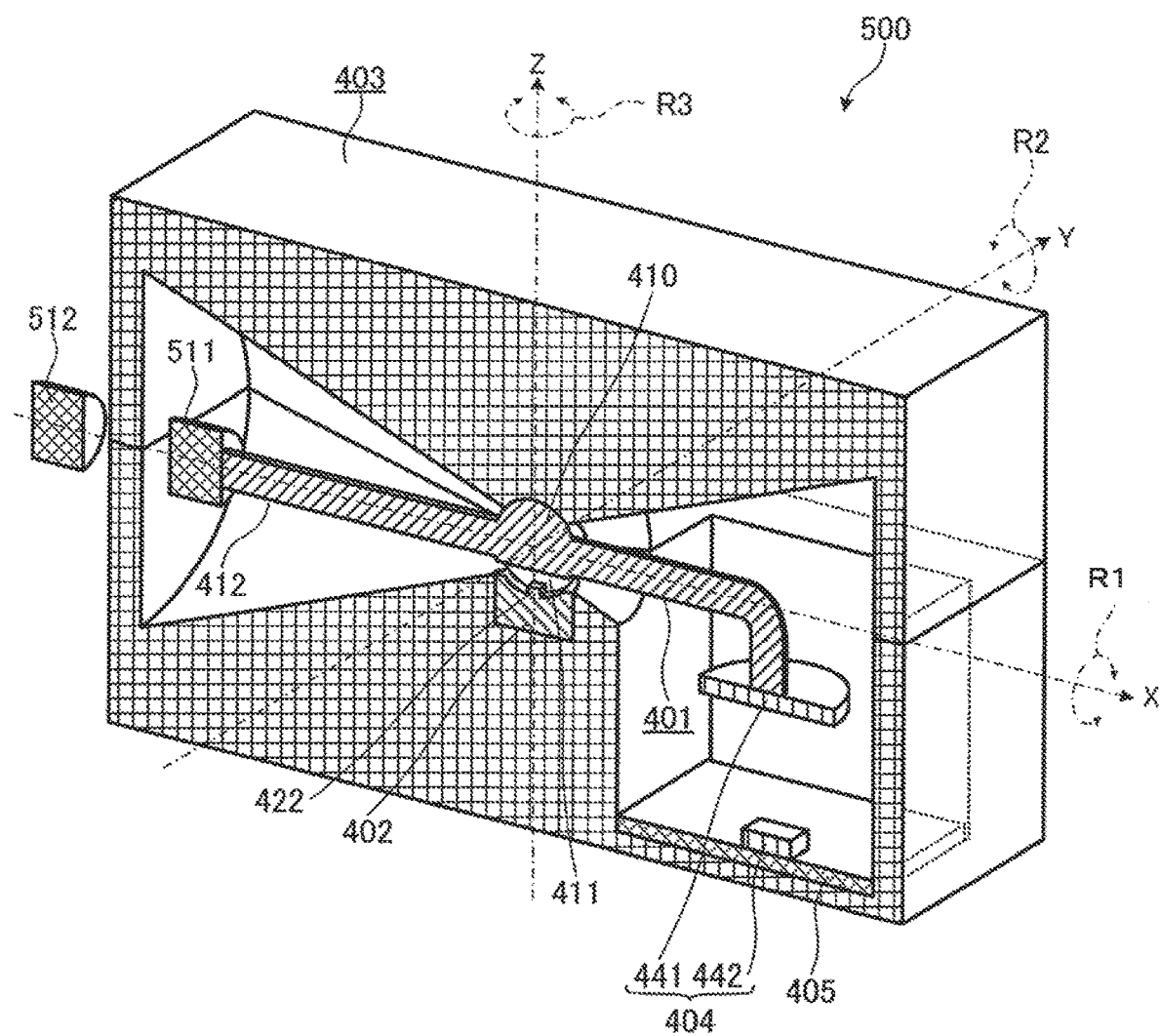
FIG. 15 is a perspective view showing a cross section of a switch in another modification.

Besides, bearing 403 is not needed to include through-part 433 as shown in FIG. 15. In other words, bearing 403 may be a box-shaped member that accommodates the entirety of shaft member 401. In this case, a force for moving shaft member 401 should be applied from the outside of bearing 403 in a non-contact manner. For that reason, first magnet 511 may be attached to an end of shaft member 401, and the force may be applied to first magnet 511 from the outside of bearing 403 by using second magnet 512, for example. Furthermore, sensor 404 and board 405 may be accommodated in bearing 403. This makes it possible to package switch 500 as a component by using bearing 403 as a housing.

Further, the present exemplary embodiment has described that first engaging portion 411 of spherical body 410 is engaged with second engaging portion 422 of turnable body 402 to restrict the rotation in first rotational direction R1 about the first axis (X-axis in the view), but is not limited to this. Rotations or turns about any other axis directions, such as the second axis (Y-axis in the view) and the third axis (Z-axis in the view), with respect to bearing 403 may be restricted.

Furthermore, an engagement relationship between first engaging portion 411 and second engaging portion 422 may be restricted so as to have a margin (looseness) to some extent. In other words, the rotation of shaft member 401 about the first axis may be allowed within a predetermined range, and the rotation beyond the predetermined range may be restricted.

Third Exemplary Embodiment

Next, as a third exemplary embodiment, a transmission mechanism, a lever mechanism, and a non-contact lever switch will specifically be described with reference to the drawings. Herein, the transmission mechanism is one embodiment of spherical bearing device 400, and is included in the lever mechanism and the non-contact lever switch.

Note that, the exemplary embodiment described below represents one application of the present disclosure.

Hereinafter, the third exemplary embodiment will be described with reference to FIGS. 16 to 28.

Figure 16:
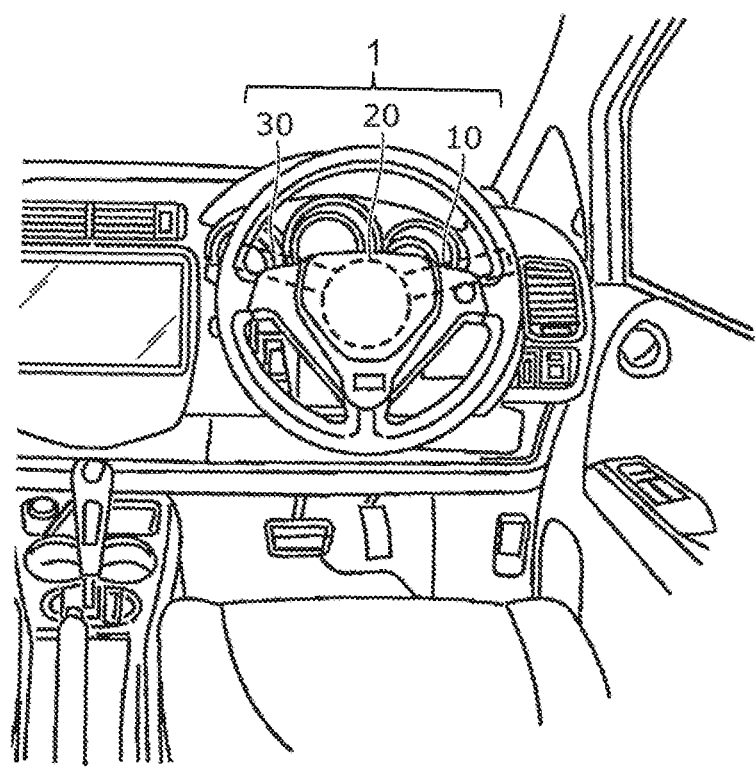
FIG. 16 is a view showing an installation example of a non-contact lever switch in accordance with a third exemplary embodiment.
Figure 17:
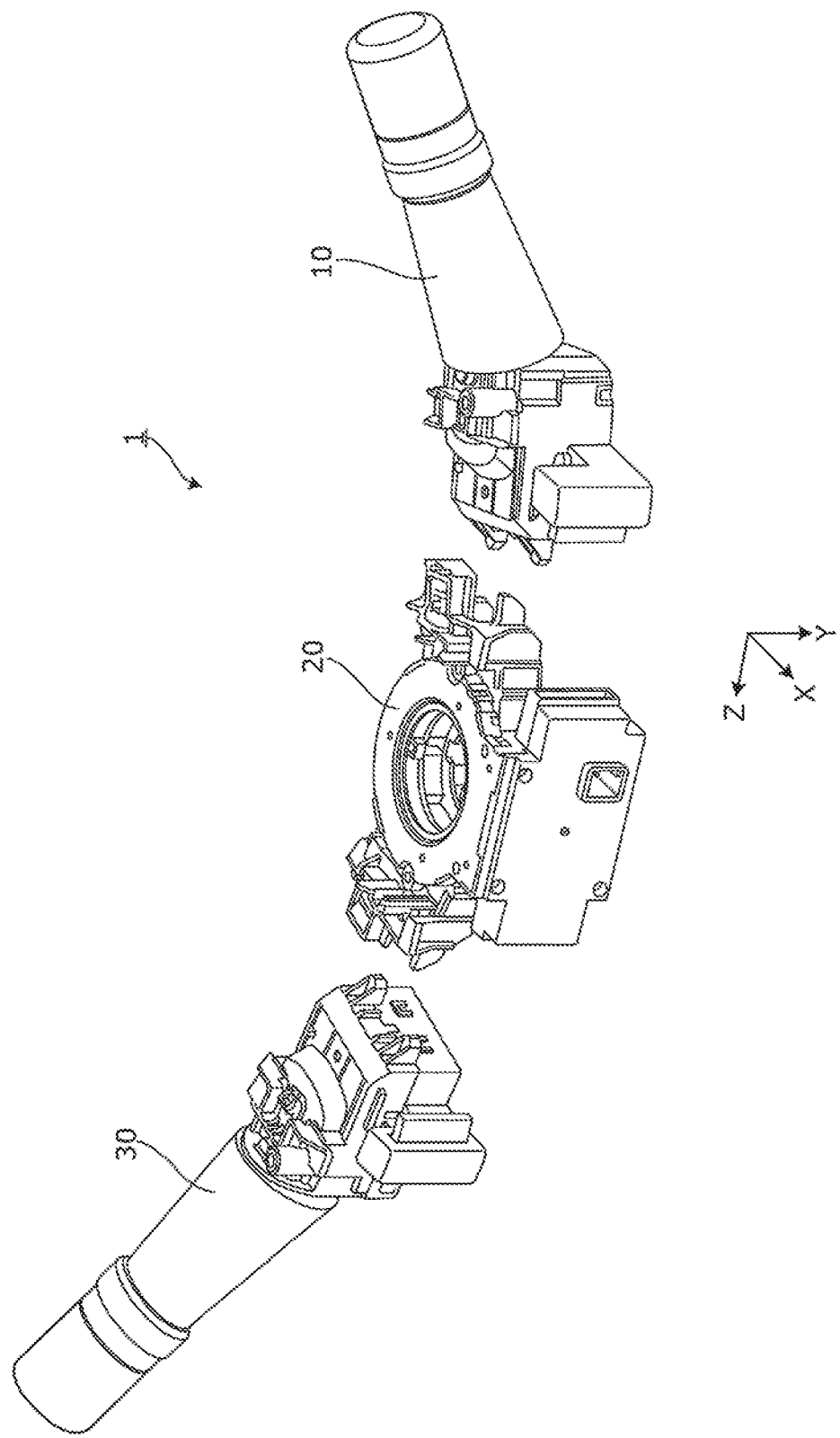
FIG. 17 is a view showing a relationship between a lever mechanism and a steering column in accordance with the third exemplary embodiment.

FIG. 16 is a view showing an installation example of the non-contact lever switch in accordance with the third exemplary embodiment. FIG. 17 is an exploded view of the non-contact lever switch and a control device in accordance with the third exemplary embodiment.

As shown in FIG. 16, non-contact lever switch 1 is installed in, for example, driver's seat of a car, and includes lever mechanisms 10 and 30 and control device 20. Lever mechanisms 10 and 30 are disposed such that levers of lever mechanisms 10 and 30 are extended from control device 20 along left and right directions (Z-axis direction) of the page, respectively.

Lever mechanism 10 is connected to a right-hand side of control device 20. Lever mechanism 10 functions as a light switch together with a magnetic sensor which is a detecting unit included in control device 20. The light switch is equipped for switching operations such as turning on and off blinkers, and turning on and off a headlight.

Lever mechanism 30 is connected to a left-hand side of control device 20. Lever mechanism 30 functions as a windshield wiper switch together with another magnetic sensor which is another detecting unit included in control device 20. The windshield wiper switch is equipped for switching operations such as turning on and off a windshield wiper.

Control device 20 is a steering column that functions as a revolving shaft of a steering wheel, and includes a circuit board on which magnetic sensors, described later, are disposed.

Note that, in the present exemplary embodiment, a direction in which the revolving shaft of the steering wheel is extended is defined as Y-axial direction, and a direction substantially orthogonal to Y-axial direction and Z-axial direction is defined as X-axial direction. X-axial direction, Y-axial direction, and Z-axial direction are substantially orthogonal to one another. Further, hereinafter, a side to which arrow heads of X-axial direction, Y-axial direction, and Z-axial direction are directed is referred to as a positive side, and an opposite side thereof is referred to as a negative side.

As shown in FIG. 17, lever mechanisms 10 and 30 are fixed to predetermined positions at both ends in Z-axial direction of control device 20. Lever mechanisms 10 and 30 are disposed such that the levers of lever mechanisms 10 and 30 are inclined from Z-axial direction to the negative side in Y-axial direction. No electric wirings are provided between lever mechanism 10 and control device 20 and between lever mechanism 30 and control device 20.

Next, a functional configuration of the non-contact lever switch will be described.

Figure 18:
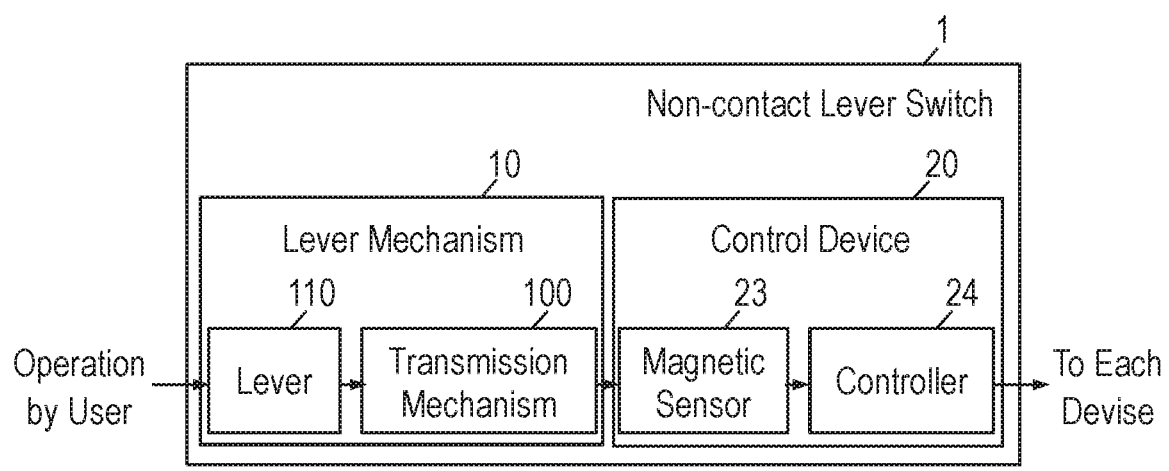
FIG. 18 is a block diagram showing a functional configuration of the non-contact lever switch.

FIG. 18 is a block diagram showing the functional configuration of the non-contact lever switch.

Figure 19:
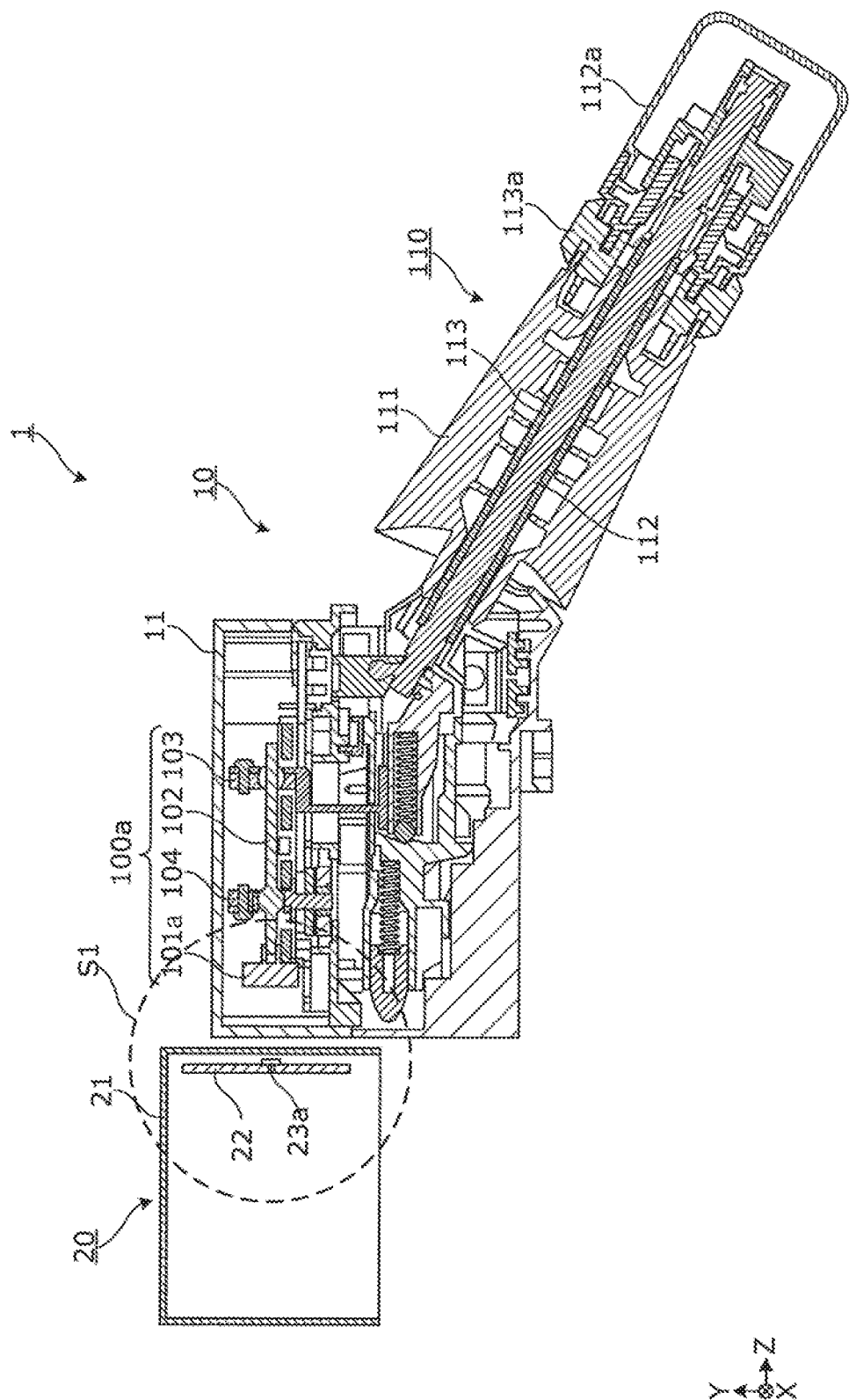
FIG. 19 is a cross-sectional view when the lever mechanism and the steering column are taken along Y-Z plane.
Figure 20:
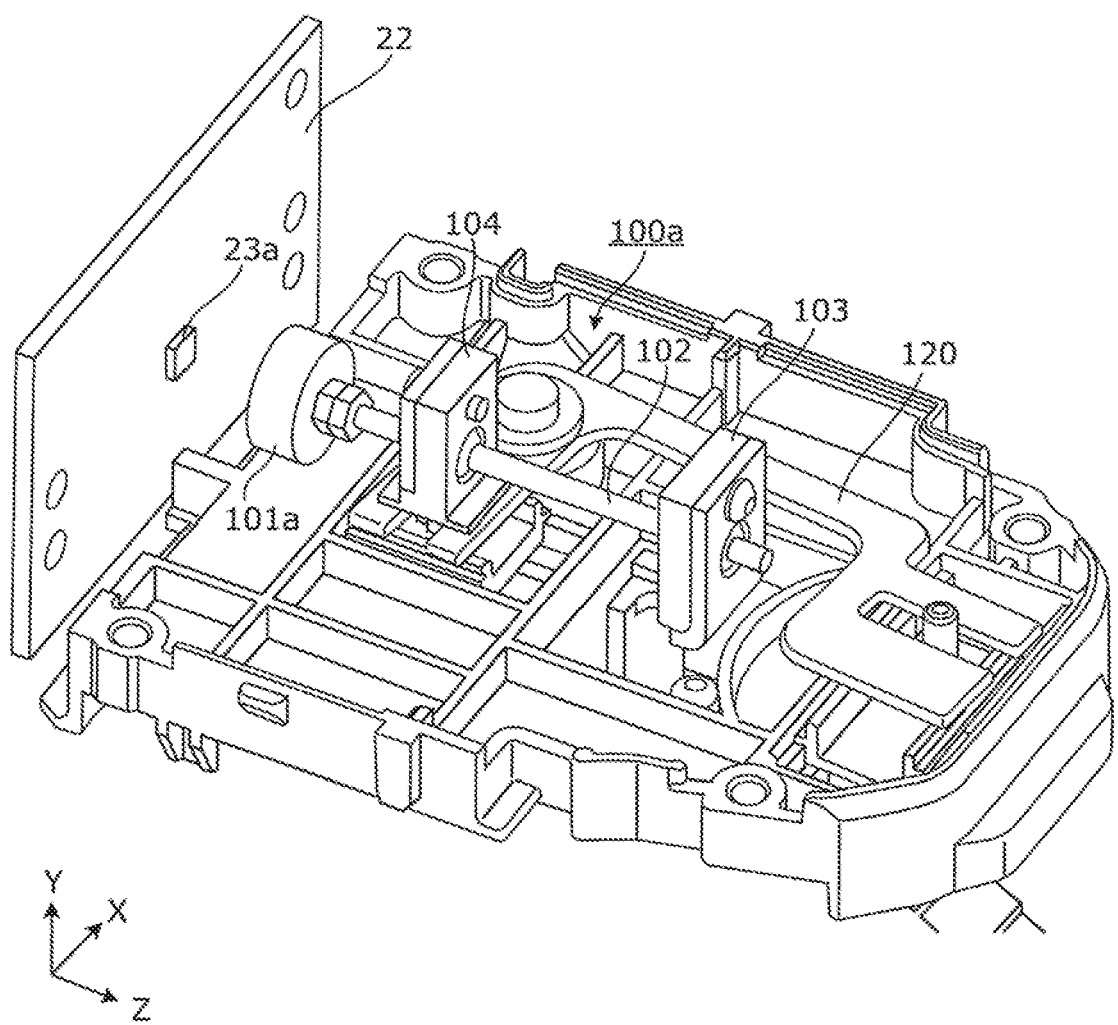
FIG. 20 is a view for explaining a relationship between a circuit board and a transmission mechanism.
Figure 21:
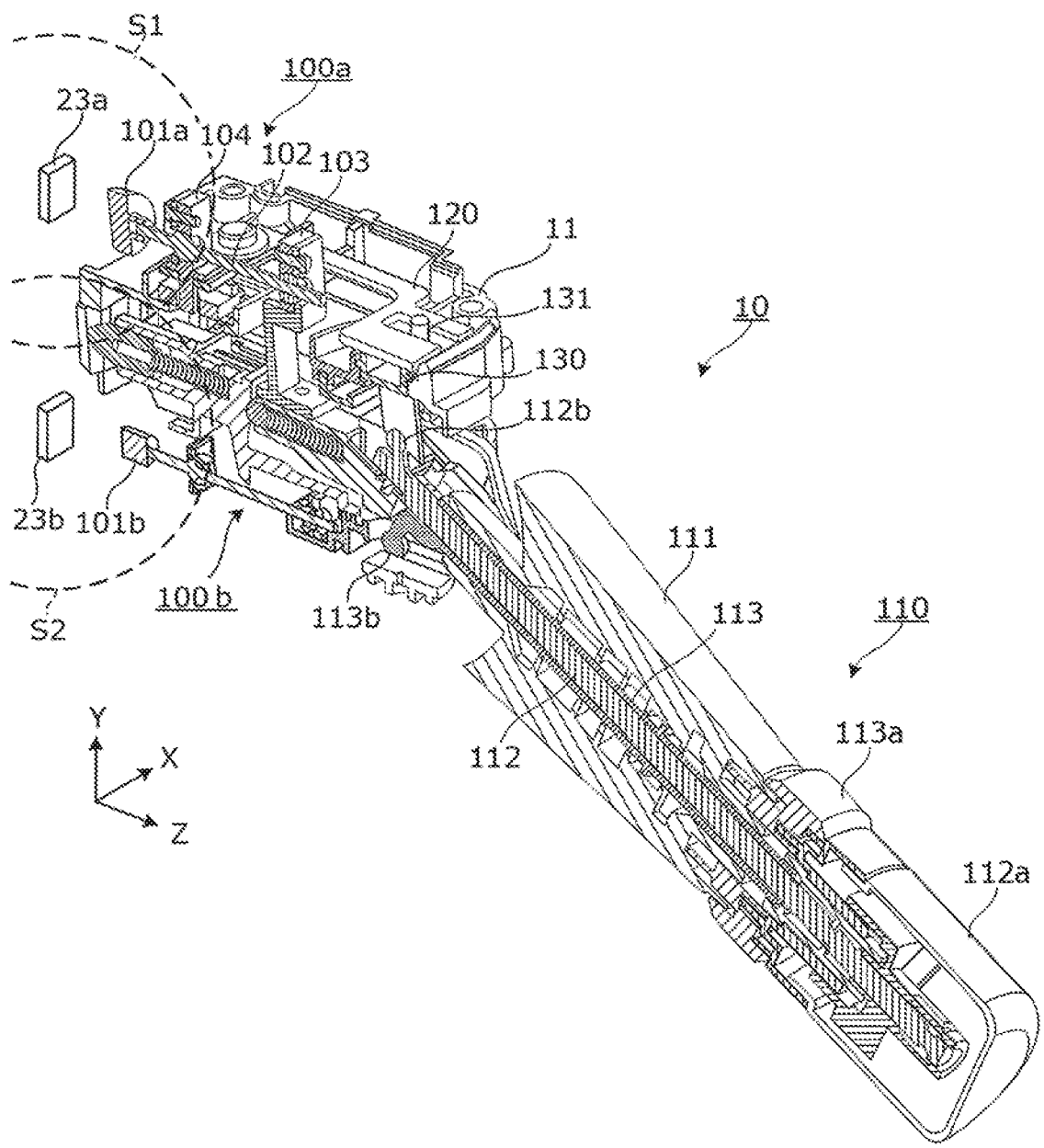
FIG. 21 is a perspective view of the non-contact lever switch taken along Y-Z plane.

FIG. 19 is a cross-sectional view when the lever mechanism and the control unit are taken along Y-Z plane. FIG. 20 is a view for explaining a relationship between a circuit board and a transmission mechanism. FIG. 21 is a perspective view of the non-contact lever switch taken along Y-Z plane.

As shown in FIG. 18, non-contact lever switch 1 includes lever mechanism 10 and control device 20. Lever mechanism 10 includes lever 110 and transmission mechanism 100. Lever 110 receives a user's operation. Transmission mechanism 100 moves an object to be moved by an amount of displacement smaller than an amount of displacement of lever 110. The displacement is caused by the user's operation and received by lever 110. Transmission mechanism 100 is composed of first transmission mechanism 100a and second transmission mechanism 100b, as shown in FIGS. 19 to 21. First transmission mechanism 100a has first permanent magnet 101a which corresponds to first component 441 serving as the object to be moved, and second transmission mechanism 100b has second permanent magnet 101b which corresponds to first component 441 serving as the object to be moved. Note that, a detailed configuration of lever mechanism 10 will be described later.

Further, control device 20 includes magnetic sensor 23 serving as second component 442, and controller 24.

Magnetic sensor 23 is composed of first magnetic sensor 23a and second magnetic sensor 23b as shown in FIGS. 19 to 21. First magnetic sensor 23a detects a position of first permanent magnet 101a moved by first transmission mechanism 100a. Second magnetic sensor 23b detects a position of second permanent magnet 101b moved by second transmission mechanism 100b. First magnetic sensor 23a and second magnetic sensor 23b are sensors constituted by, for example, a Hall-effect element. Note that, first magnetic sensor 23a and second magnetic sensor 23b are not limited to a Hall-effect element, but may be a sensor constituted by a magnetic resistive element. First magnetic sensor 23a detects a change in magnetic field of first detection area S1 (see FIG. 19), and outputs the detected result. Second magnetic sensor 23b detects a change in magnetic field of second detection area S2 (see FIG. 21), and outputs the detected result. Note that, first magnetic sensor 23a and second magnetic sensor 23b may be disposed on a sheet of circuit board 22 (e.g., see FIG. 19), or may be disposed on separate circuit boards.

Based on the results detected by first magnetic sensor 23a and second magnetic sensor 23b, controller 24 specifies a three dimensional position of first permanent magnet 101a in first detection area S1 of first magnetic sensor 23a, and specifies a three dimensional position of second permanent magnet 101b in second detection area S2 of second magnetic sensor 23b. Depending on each of the specified three-dimensional positions of first permanent magnet 101a and second permanent magnet 101b, controller 24 switches operations of each device such as blinkers or a headlight. Controller 24 is constituted by, for example, a processor and a memory that stores programs. For instance, an output (for example, voltage value) of first magnetic sensor 23a and the three dimensional position of first magnetic sensor 23a in first detection area S1 are correlated with each other in advance. Controller 24 specifies a coordinate value indicating the three-dimensional position of first magnetic sensor 23a that corresponds to the detected result. Note that, controller 24 performs the same processing as that of first magnetic sensor 23a to specify a coordinate value indicating the three-dimensional position of second magnetic sensor 23b.

As shown in FIGS. 19 to 21, lever mechanism 10 includes first transmission mechanism 100a, second transmission mechanism 100b, and lever 110.

Further, lever mechanism 10 includes second case 11 for accommodating a supported portion of lever 110, and first transmission mechanism 100a.

Second case 11 is connected to a predetermined position on the outside of first case 21, which serves as a case of control device 20. Note that, the supported portion of lever 110 includes, for example, at least a portion between a rocking axis of lever 110 and an opposite end of lever 110 from a handle.

First transmission mechanism 100a includes first permanent magnet 101a serving as the object to be moved, first rocking member 102 which is one of shaft members 401, and first supporting body 103 and second supporting body 104 which support first rocking member 102 together. Especially, second supporting body 104 is bearing 403. When lever 110 is rocked in the state where first case 21 and second case 11 are connected to each other, first transmission mechanism 100a causes first permanent magnet 101a to move within first detection area S1 of first magnetic sensor 23a.

First rocking member 102 is a rod member extending in Z-axial direction (first direction). At an end of first rocking member 102, first permanent magnet 101a is disposed For instance, first permanent magnet 101a is fixed to an end on the negative side in Z-axial direction of first rocking member 102. First rocking member 102 is, for example, a metal member having predetermined stiffness.

First supporting body 103 and second supporting body 104 support first rocking member 102 in a rocking manner at two different positions in Z-axial direction of first rocking member 102. Among first supporting body 103 and second supporting body 104, first supporting body 103 is disposed on the positive side in Z-axial direction and can be moved according to the displacement inputted by lever 110. Among first supporting body 103 and second supporting body 104, second supporting body 104 is disposed on the negative side in Z-axial direction and supports first rocking member 102 as a fulcrum such that first rocking member 102 can rock about the first axis parallel to X-axial direction as a fulcrum (first rocking) and can rock about the second axis parallel to Y-axial direction as a fulcrum (second rocking). In other words, second supporting body 104 supports first rocking member 102 such that first rocking member 102 can rock about at least two axes whose directions are different from each other.

Further, first transmission mechanism 100a may further include second rocking member 120. Second rocking member 120 rocks about a fifth axis parallel to Y-axial direction as a fulcrum according to the displacement inputted by lever 110, and applies a third input, which serves as displacement along Z-axial direction, to second supporting body 104.

Lever 110 is supported so as to be rockable about the third axis parallel to X-axial direction as a fulcrum (third rocking) and be rockable about the fourth axis parallel to Y-axial direction as a fulcrum (fourth rocking) according to movement of the handle. In other words, lever 110 is supported to be rockable about two axes whose directions are different from each other, according to movement of the handle. Further, an opposite end of lever 110 from the handle is fixed to first supporting body 103 in the state where an axis of the third rocking and an axis of the fourth rocking are interposed between the handle and the opposite end. In other words, lever 110 is allowed to apply displacement to first supporting body 103 through the third rocking and the fourth rocking. In this way, lever 110 applies the first input to first supporting body 103 of first transmission mechanism 100a through the third rocking, and applies the second input to first supporting body 103 of first transmission mechanism 100a through the fourth rocking.

Further, lever 110 has first lever member 111, second lever member 112, and third lever member 113. First lever member 111 is rockably supported with respect to second case 11. Second lever member 112 is disposed inside first lever member 111. Second lever member 112 is provided to be rotatable about an axis parallel to an extending direction (i.e., direction inclined from Z-axial direction to the negative side in Y-axial direction) of lever 110 as a rotational axis, with respect to first lever member 111, and extends in the extending direction. Third lever member 113 is disposed inside first lever member 111 and outside second lever member 112. Third lever member 113 is provided to be rotatable about an axis parallel to the extending direction of lever 110 as a rotational axis, with respect to first lever member 111 and second lever member 112, and extends in the extending direction.

Specifically, first lever member 111 has a cylindrical space therein. Third lever member 113 is a cylindrical member. The external shape of third lever member 113 follows the above-mentioned cylindrical space formed inside first lever member 111, and disposed inside the above-mentioned cylindrical space. Furthermore, second lever member 112 is a cylindrical member. The external shape of second lever member 112 follows a cylindrical space formed inside third lever member 113, and disposed inside the above-mentioned cylindrical space formed inside third lever member 113. According to the structure, second lever member 112 can rotate about an axis parallel to the extending direction as a rotating axis with respect to first lever member 111 and third lever member 113, and third lever member 113 can rotate about the axis parallel to the extending direction as a rotational axis with respect to first lever member 111 and second lever member 112.

Further, second lever member 112 has knob 112a, and protrusion 112b that is disposed at an end on a rocking axis side of lever 110. When a driver rotates knob 112a, second lever member 112 is rotated with respect to first lever member 111 and third lever member 113, thereby moving protrusion 112b. This causes first sliding member 130, which is provided to be slidable in X-axial direction, to move in X-axial direction with respect to second case 11. As first sliding member 130 is moved, projection part 131 provided in the first sliding member moves, thereby making it possible to rock second rocking member 120.

Further, third lever member 113 has knob 113a, and protrusion 113b that is disposed at an end on the rocking axis side of lever 110. When the driver rotates knob 113a, third lever member 113 rotates with respect to first lever member 111 and second lever member 112, and thus protrusion 113b is moved. This makes it possible to rock second transmission mechanism 100b. Note that, second transmission mechanism 100b has the same configuration as that of first transmission mechanism 100a. Therefore, the description thereof is omitted.

Control device 20 includes first case 21, and circuit board 22 serving as board 405 equipped with first magnetic sensor 23a, as shown in FIG. 19. Circuit board 22 is accommodated in first case 21. First magnetic sensor 23a is disposed in a direction and at a position such that first detection area S1 of first magnetic sensor 23a is arranged toward a predetermined position to be connected to second case 11 located outside first case 21. Note that, a processor that functions as controller 24 described in FIG. 18, and a memory may be mounted on circuit board 22. Alternatively, the processor constituting controller 24, and the memory may be disposed outside first case 21.

Second supporting body 104 supports first rocking member 102 as a fulcrum, and first rocking member 102 is configured to be rockable about a first axis parallel to X-axial direction as a fulcrum (first rocking) and be rockable about a second axis parallel to Y-axial direction as a fulcrum (second rocking). Herein, a concrete configuration of first transmission mechanism 100a for achieving the first rocking and the second rocking of first rocking member 102 will be described with reference to FIG. 22.

Figure 22:
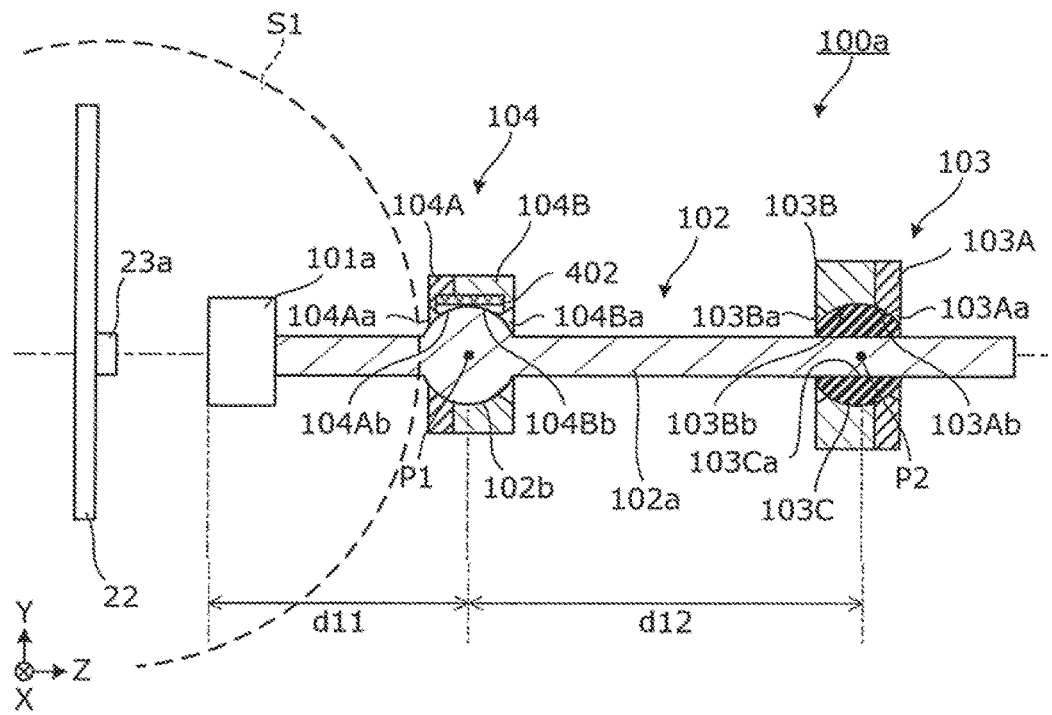
FIG. 22 is a cross-sectional view of the transmission mechanism in Y-Z plane.

FIG. 22 is a cross-sectional view of the transmission mechanism in Y-Z plane.

As shown in FIG. 22, first rocking member 102 has rod portion 102a with a rod-like shape serving as shaft body 412, and spherical part 102b serving as spherical body 410 with a spherical shape whose diameter is larger than a width of rod portion 102a. Herein, spherical body 410 is formed at a position separated from an end on the negative side in Z-axial direction of rod portion 102a by first distance d11. First rocking member 102 is spherically supported by second supporting body 104 on spherical part 102b. Further, first distance d11 between second supporting body 104 and the end (permanent magnet 101) on the negative side in Z-axial direction of first rocking member 102 is shorter than second distance d12 between first supporting body 103 and second supporting body 104.

Second supporting body 104 serving as bearing 403 is composed of pressing member 104A disposed on the negative side in Z-axial direction, and main support member 104B disposed on the positive side in Z-axial direction. Pressing member 104A and main support member 104B have through holes 104Aa and 104Ba through which rod portion 102a passes, and spherical surfaces 104Ab and 104Bb which are in spherical contact with spherical part 102b, respectively. In other words, a portion on the negative side in Z-axial direction of rod portion 102a from spherical part 102b passes through through hole 104Aa of pressing member 104A, and spherical surface 104Ab of pressing member 104A is in contact with the negative side in Z-axial direction of spherical part 102b. Further, a portion on the positive side in Z-axial direction of rod portion 102a from spherical part 102b passes through through hole 104Ba of main support member 104B, and spherical surface 104Bb of main support member 104B is in contact with the positive side in Z-axial direction of spherical part 102b.

Note that, each of through holes 104Aa and 104Ba has a substantially conical shape whose diameter is increased as the distance from spherical part 102b is increased, so that rod portion 102a can be rocked about center P1 of spherical part 102b as a fulcrum. Further, main support member 104B has a width in Z-axial direction larger than that of pressing member 104A. Thus, spherical surface 104Bb is in contact with not only the positive side in Z-axis direction of spherical part 102b but the negative side in Z-axis direction of spherical part 102b.

Pressing member 104A and main support member 104B are fixed to each other with a fastening member (not shown), such as a screw or a rivet, in the state where rod portion 102a of first rocking member 102 passes through pressing member 104A and main support member 104B, and spherical part 102b is interposed between pressing member 104A and main support member 104B in Z-axial direction. In this way, spherical part 102b of first rocking member 102 is spherically supported by second supporting body 104.

First supporting body 103 is composed of pressing member 103A disposed on the positive side in Z-axial direction, and main support member 103B disposed on the negative side in Z-axial direction. First supporting body 103 further has spherical surface member 103C that is in spherical contact with pressing member 103A and main support member 103B. Pressing member 103A and main support member 103B have through holes 103Aa and 103Ba through which rod portion 102a passes, and spherical surfaces 103Ab and 103Bb that are in spherical contact with spherical surface member 103C, respectively. In other words, spherical surface 103Ab of pressing member 103A is in contact with the positive side in Z-axial direction of spherical surface member 103C, and spherical surface 103Bb of main support member 103B is in contact with the negative side in Z-axial direction of spherical surface member 103C.

Note that, each of through holes 103Aa and 103Ba has a substantially conical shape whose diameter is increased as the distance from spherical surface member 103C is increased, so that rod portion 102a can be rocked about center P2 of spherical surface member 103C as a fulcrum. Further, main support member 103B has a width in Z-axial direction larger than that of pressing member 103A. Thus, spherical surface 103Bb is in contact with not only the negative side in Z-axial direction of spherical surface member 103C but the positive side in Z-axial direction of spherical surface member 103C.

Spherical surface member 103C has through hole 103Ca through which rod portion 102a passes. Through hole 103Ca has a shape that follows an external surface of rod portion 102a, and an internal surface of through hole 103Ca is in contact with the external surface of rod portion 102a. Thus, spherical surface member 103C is configured to be slidable with rod portion 102a in through hole 103Ca. In other words, first rocking member 102 is slidably connected with first supporting body 103 in a direction (first direction) in which rod portion 102a of first rocking member 102 extends. Further, rod portion 102a of first rocking member 102 is connected with first supporting body 103 so as to be rockable about center P2 of spherical surface member 103C as a fulcrum in the state where rod portion 102a passes through through hole 103Ca of spherical surface member 103C.

Further, first rocking member 102 is configured to be movable in Z-axial direction. Now, a concrete configuration of transmission mechanism 100a in which first rocking member 102 is movable in Z-axial direction will be described with reference to FIG. 23.

Figure 23:
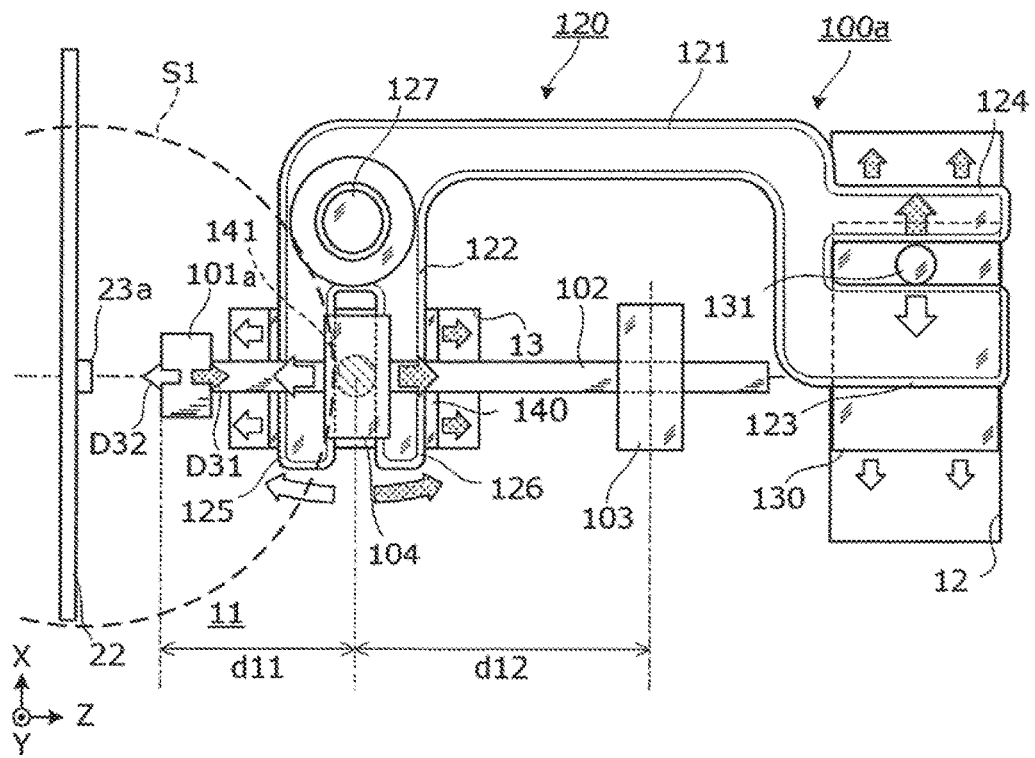
FIG. 23 is a plan view of the transmission mechanism when viewed from above (positive side in Z-axis direction).

FIG. 23 is a plan view of the transmission mechanism when viewed from above (positive side in Y-axial direction).

As shown in FIG. 23, first transmission mechanism 100a includes second rocking member 120, first sliding member 130, and second sliding member 140, in addition to first permanent magnet 101a, first rocking member 102, first supporting body 103, and second supporting body 104.

First sliding member 130 is supported to be slidable in X-axial direction with respect to opening 12 that has an elongated rectangular shape in X-axial direction and is formed in second case 11. Further, first sliding member 130 has cylindrical projection part 131 projected toward the positive side in Y-axial direction.

Second sliding member 140 is supported to be slidable in Z-axial direction with respect to opening 13 that has an elongated rectangular shape in Z-axial direction and is formed in second case 11. Further, second sliding member 140 has cylindrical projection part 141 projected toward the positive side in Y-axial direction, and is fixed to second supporting body 104 via projection part 141. In other words, second sliding member 140 can cause second supporting body 104 to move in Z-axial direction with respect to second case 11.

Second rocking member 120, which has a substantially L-shape, is connected to second case 11 by shaft body 127 with a substantially circular column shape such that second rocking member 120 is rockable (pivotable) about shaft body 127. Shaft body 127 is disposed on a lateral side and the positive side in X-axial direction of second supporting body 104. Second rocking member 120 has first portion 121 extending from shaft body 127 toward the positive side in Z-axial direction, and second portion 122 extending from shaft body 127 toward second supporting body 104 (i.e., negative side in X-axial direction).

First portion 121 is divided into two parts in X-axial direction. In other words, a slit extending in Z-axial direction is formed in first portion 121. Specifically, first portion 121 has third portion 123 disposed on the negative side in X-axial direction of projection part 131 of first sliding member 130, and fourth portion 124 disposed on the positive side in X-axial direction of projection part 131. In other words, first portion 121 has two portions extending from shaft body 127 toward the positive side in Z-axial direction, i.e., third portion 123 and fourth portion 124. Projection part 131 is interposed between third portion 123 and fourth portion 124.

Second portion 122 is divided into two parts in Z-axial direction. In other words, a slit extending in X-axial direction is formed in second portion 122. Specifically, second portion 122 has fifth portion 125 disposed on the negative side in Z-axial direction of projection part 141 of second sliding member 140 fixed to second supporting body 104, and sixth portion 126 disposed on the positive side in Z-axial direction of projection part 141. In other words, second portion 122 has two portions extending from shaft body 127 toward the negative side in X-axial direction, i.e., fifth portion 125 and sixth portion 126. Projection part 141 is interposed between fifth portion 125 and sixth portion 126.

Next, a concrete operation of first transmission mechanism 100a will be described with reference to FIGS. 24A to 24C, FIGS. 25A to 25C, and FIGS. 26A to 26C.

Figure 24A:
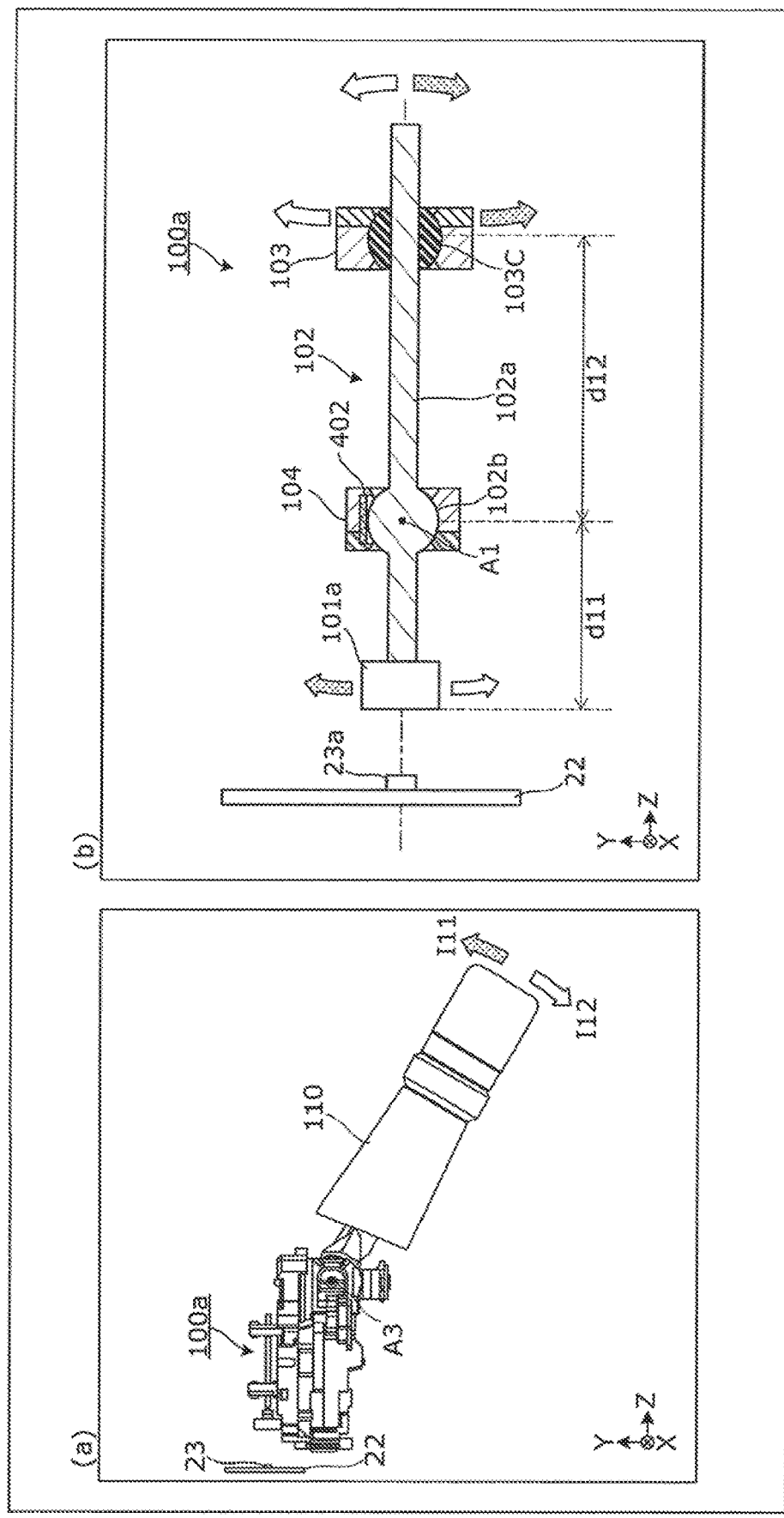
FIG. 24A is a view for explaining a relationship between a lever operation in which a third axis is employed as a fulcrum and movement of the transmission mechanism.
Figure 24B:
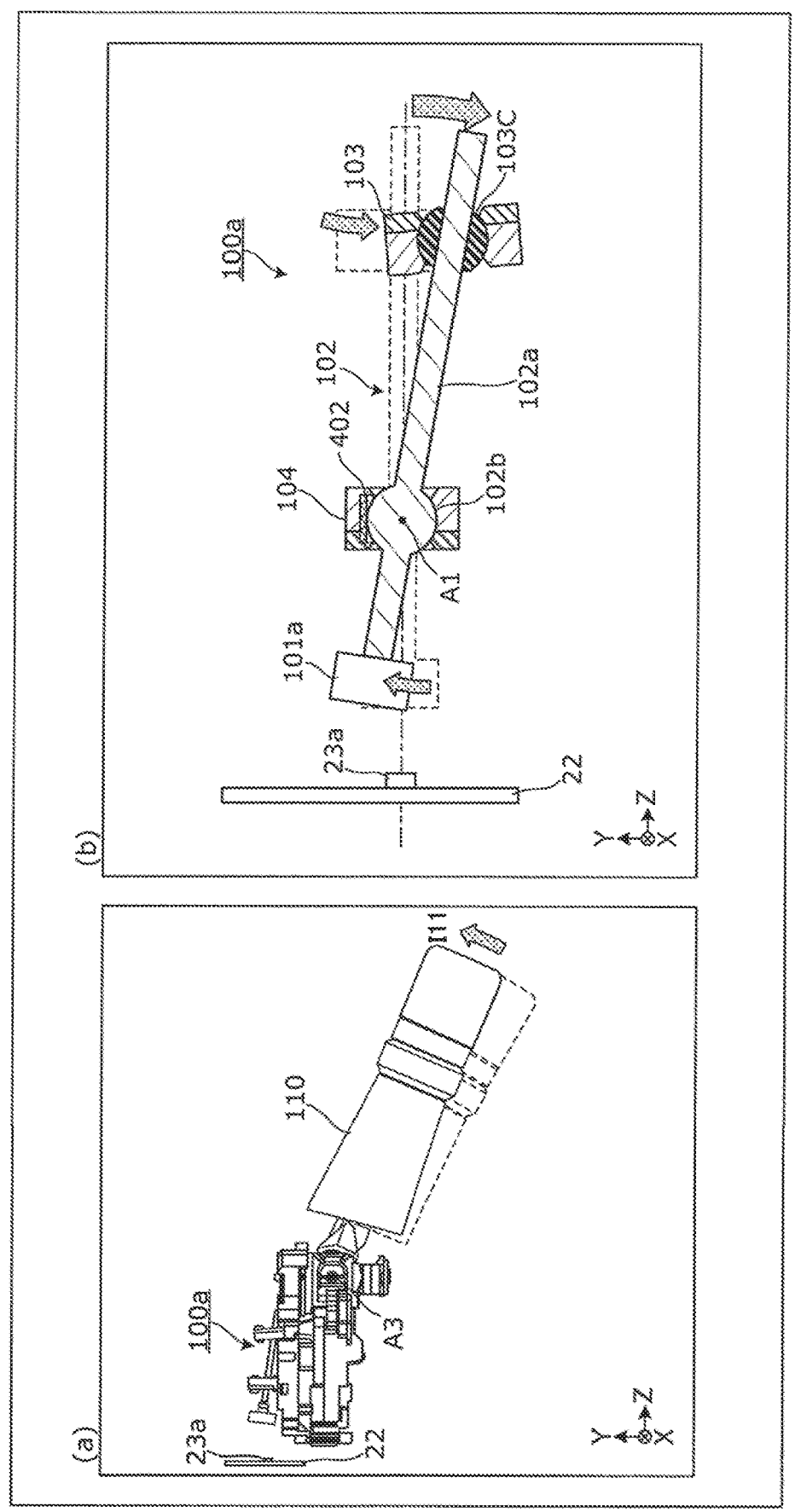
FIG. 24B is a view for explaining a relationship between the lever operation in which the third axis is employed as a fulcrum and movement of the transmission mechanism.
Figure 24C:
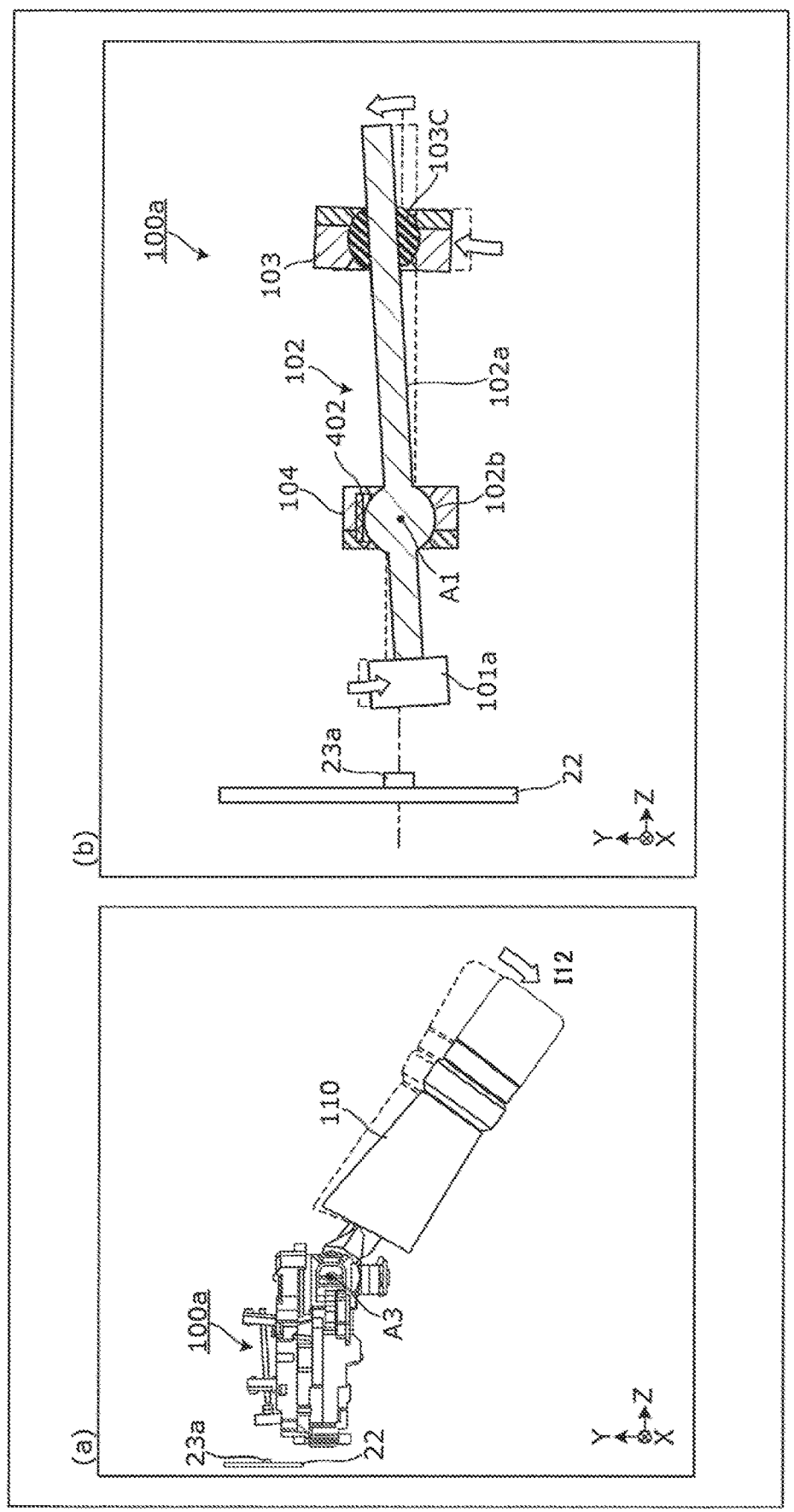
FIG. 24C is a view for explaining a relationship between the lever operation in which the third axis is employed as a fulcrum and movement of the transmission mechanism.

FIGS. 24A to 24C are views for explaining a relationship between a lever operation, in which the third axis is employed as a fulcrum, and movement of the transmission mechanism.

Herein, (a) of FIG. 24A is a view showing the state where lever 110 is rocked about third axis A3 as a fulcrum, when a driver applies, to lever 110, input I11 or input I12 about third axis A3 parallel to X-axial direction as a fulcrum. Further, (b) of FIG. 24A is a view for explaining movement of first transmission mechanism 100a when first supporting body 103 receives a first input due to the rocking (third rocking) of lever 110 shown in (a) of FIG. 24A. Furthermore, (b) of FIG. 24A shows a cross-sectional view of circuit board 22 and transmission mechanism 100a taken along Y-Z plane. Still further, FIG. 24B shows an example when input I11 is applied to the lever 110, and (a) and (b) of FIG. 24B are views corresponding to (a) and (b) of FIG. 24A, respectively. Still furthermore, FIG. 24C shows an example when input I12 is applied to lever 110, and (a) and (b) of FIG. 24C are views corresponding to (a) and (b) of FIG. 24A, respectively.

When the driver applies input I11 or I12 and rocks lever 110 about third axis A3 as a fulcrum as shown in (a) of FIG. 24A, first transmission mechanism 100a is rocked about first axis A1 parallel to X-axial direction as a fulcrum (first rocking) as shown in (b) of FIG. 24A. Herein, first axis A1 passes through center P1 of spherical part 102b of first rocking member 102, and is parallel to X-axial direction.

At this time, first supporting body 103 receives the first input due to the third rocking of lever 110, and is moved in a direction intersecting with the first direction (Z-axial direction). Specifically, first supporting body 103 is coupled with an end on an operating point side of lever 110, and is moved toward a rotational direction about third axis A3 of lever 110 as a fulcrum.

Further, when the first supporting body 103 moves, first rocking member 102 is rocked about second supporting body 104 as a fulcrum. Since first distance d11 between permanent magnet 101 and second supporting body 104 is shorter than second distance d12 between first supporting body 103 and second supporting body 104, when first rocking member 102 is rocked, first rocking member 102 causes first permanent magnet 101a to move by an amount of displacement smaller than an amount of the displacement inputted to first supporting body 103.

Specifically, as shown in (a) of FIG. 24B, when the driver applies input I11 toward the positive side in Y-axial direction, first supporting body 103 is turned about third axis A3 as a fulcrum toward the negative side in Y-axial direction. Accordingly, as shown in (b) of FIG. 24B, first rocking member 102 is rocked about first axis A1 of second supporting body 104 as a fulcrum in a clockwise direction of the page, and then moves first permanent magnet 101a toward the positive side in Y-axial direction.

Further, as shown in (a) of FIG. 24C, when the driver applies input I12 toward the negative side in Y-axial direction, first supporting body 103 is turned about third axis A3 as a fulcrum toward the positive side in Y-axial direction. Accordingly, as shown in (b) of FIG. 24C, first rocking member 102 is rocked about first axis A1 of second supporting body 104 as a fulcrum in a counter clockwise direction of the page, and then moves first permanent magnet 101a toward the negative side in Y-axial direction.

Figure 25A:
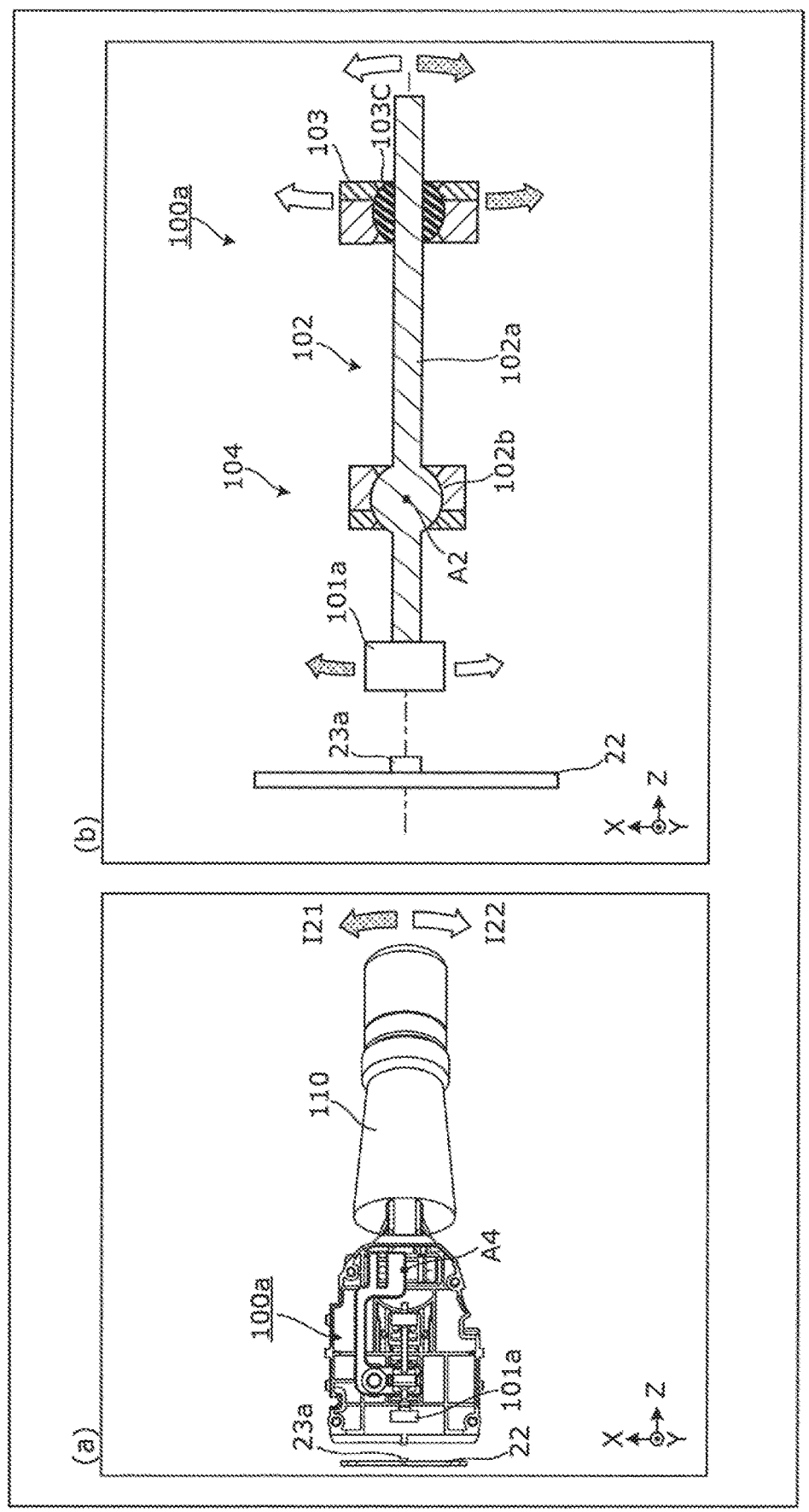
FIG. 25A is a view for explaining a relationship between a lever operation in which a fourth axis is employed as a fulcrum and movement of the transmission mechanism.
Figure 25B:
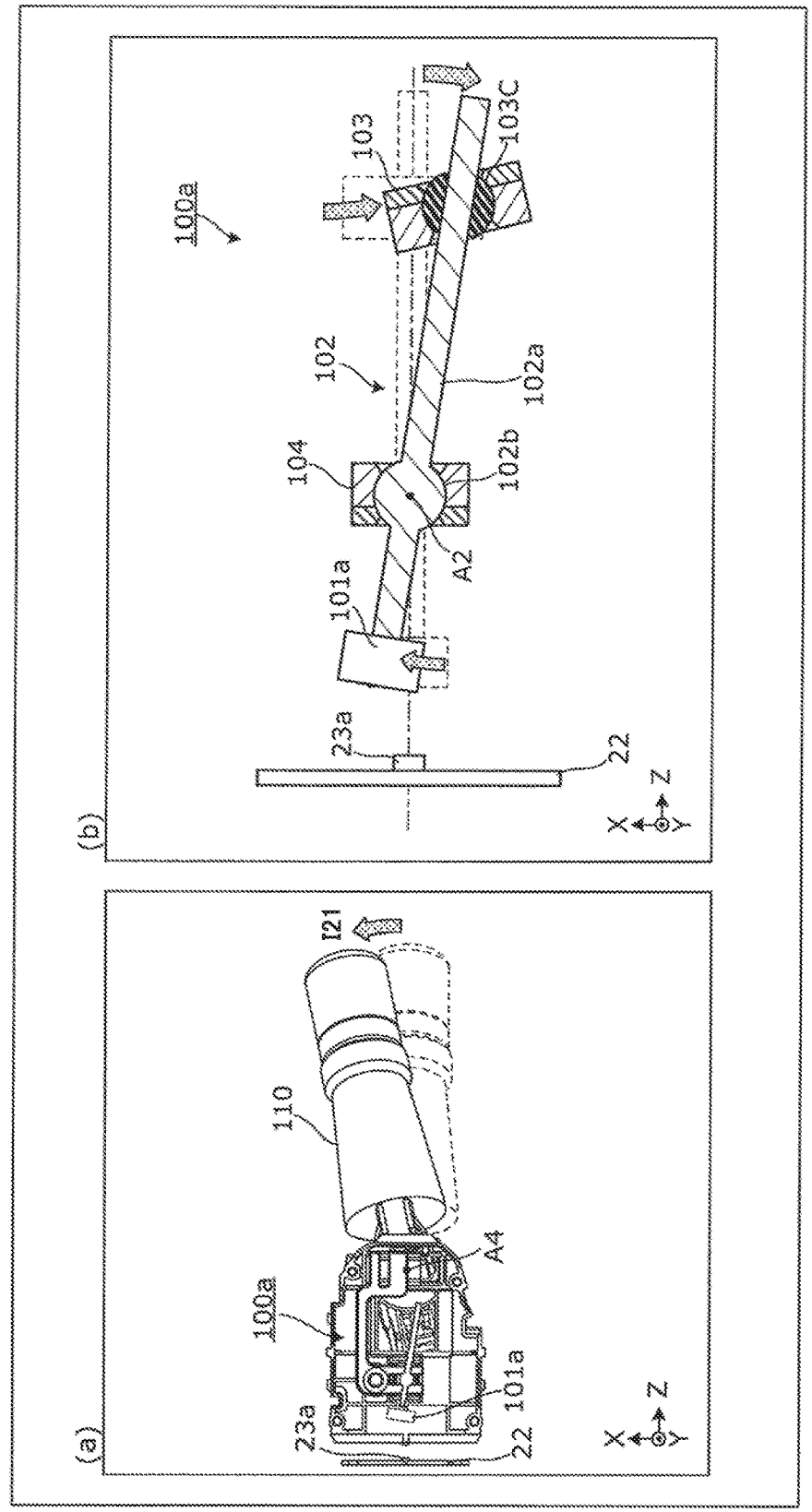
FIG. 25B is a view for explaining a relationship between the lever operation in which the fourth axis is employed as a fulcrum and movement of the transmission mechanism.
Figure 25C:
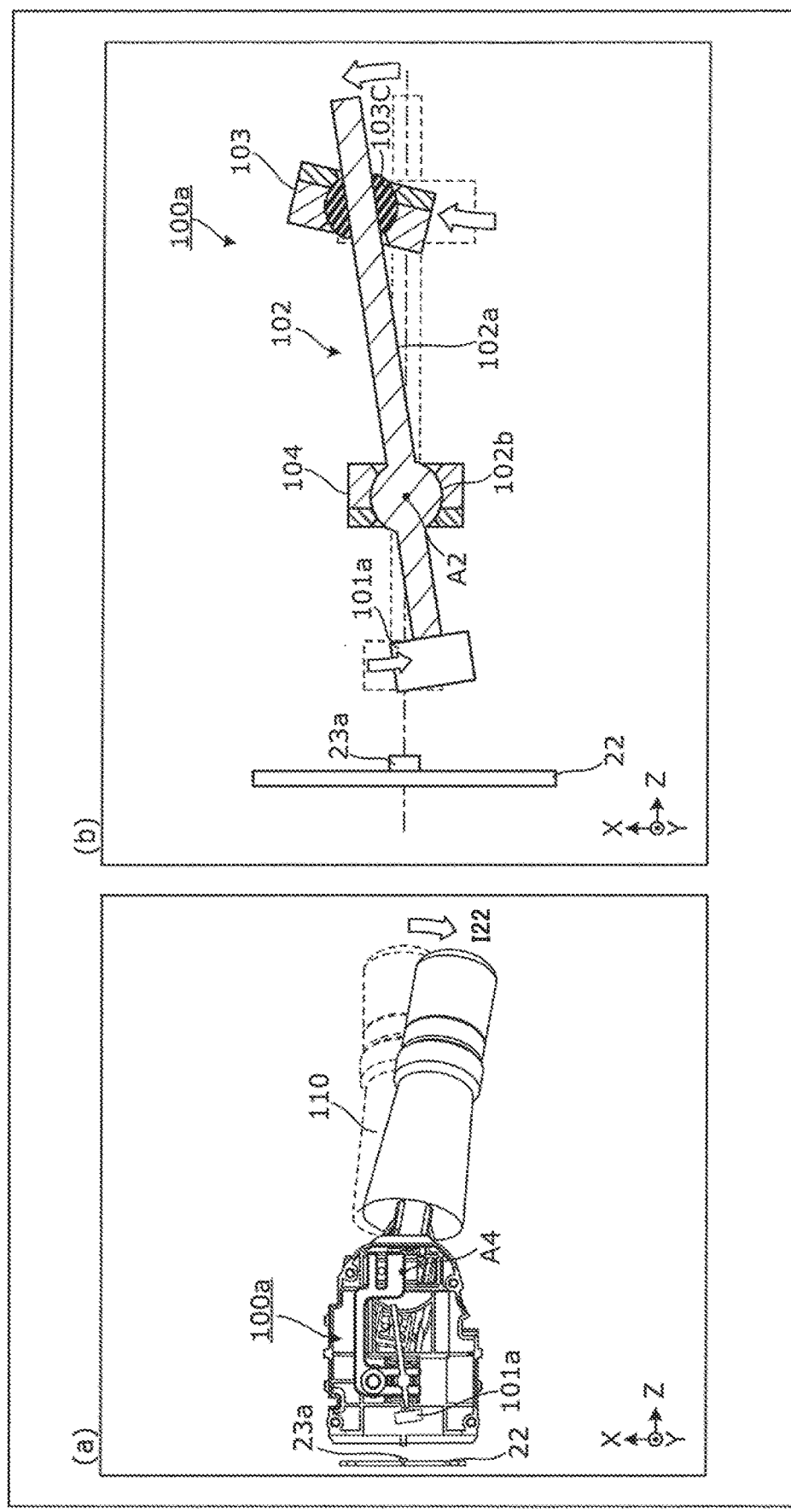
FIG. 25C is a view for explaining a relationship between the lever operation in which the fourth axis is employed as a fulcrum and movement of the transmission mechanism.

FIGS. 25A to 25C are views for explaining a relationship between a lever operation, in which the fourth axis is employed as a fulcrum, and movement of the transmission mechanism.

Herein, (a) of FIG. 25A is a view showing the state where lever 110 is rocked about fourth axis A4 as a fulcrum, when the driver applies, to lever 110, input I21 or input I22 about fourth axis A4 parallel to Y-axial direction as a fulcrum. Further, (b) of FIG. 245 is a view for explaining movement of first transmission mechanism 100a when first supporting body 103 receives a second input due to the rocking (fourth rocking) of lever 110 shown in (a) of FIG. 25A. Furthermore, (b) of FIG. 25A shows a cross-sectional view of circuit board 22 and transmission mechanism 100a taken along Y-Z plane.

Still further, FIG. 25B shows an example when input I21 is applied to the lever 110, and (a) and (b) of FIG. 25B are views corresponding to (a) and (b) of FIG. 25A, respectively. Still furthermore, FIG. 25C shows an example when input I22 is applied to lever 110, and (a) and (b) of FIG. 25C are views corresponding to (a) and (b) of FIG. 25A, respectively.

When the driver applies input I21 or I22 and rocks lever 110 about fourth axis A4 as a fulcrum as shown in (a) of FIG. 25A, first transmission mechanism 100a is rocked about second axis A2 parallel to Y-axial direction as a fulcrum (second rocking) as shown in (b) of FIG. 25A. Herein, second axis A2 passes through center P1 of spherical part 102b of first rocking member 102, and is parallel to Y-axial direction.

In the cases where first transmission mechanism 100a is rocked about second axis A2 parallel to Y-axial direction as a fulcrum shown in FIGS. 25A to 25C, movement of first transmission mechanism 100a is also the same as the movement described in FIGS. 24A to 24C, except that the direction of the rocking axis is different. In other words, according to the description in FIGS. 24A to 24C, first supporting body 103 receives a first input due to movement along the second direction (Y-axial direction) intersecting with Z-axial direction, and a second input due to movement along the third direction (X-axial direction) intersecting with Z-axial direction and Y-axial direction. Upon receiving the first input, first rocking member 102 is rocked about first axis A1, which is one of the two axes in second supporting body 104, as a fulcrum. Thereby first rocking member 102 moves first permanent magnet 101a along Y-axial direction different from Z-axial direction. Further, upon receiving, at first supporting body 103, the second input which has a different direction from the first input, first rocking member 102 is rocked about second axis A2, which is one of the two axes, as a fulcrum. Thereby first rocking member 102 moves first permanent magnet 101a along a third direction (X axial direction) different from Z-axial direction and Y-axial direction.

Figure 26A:
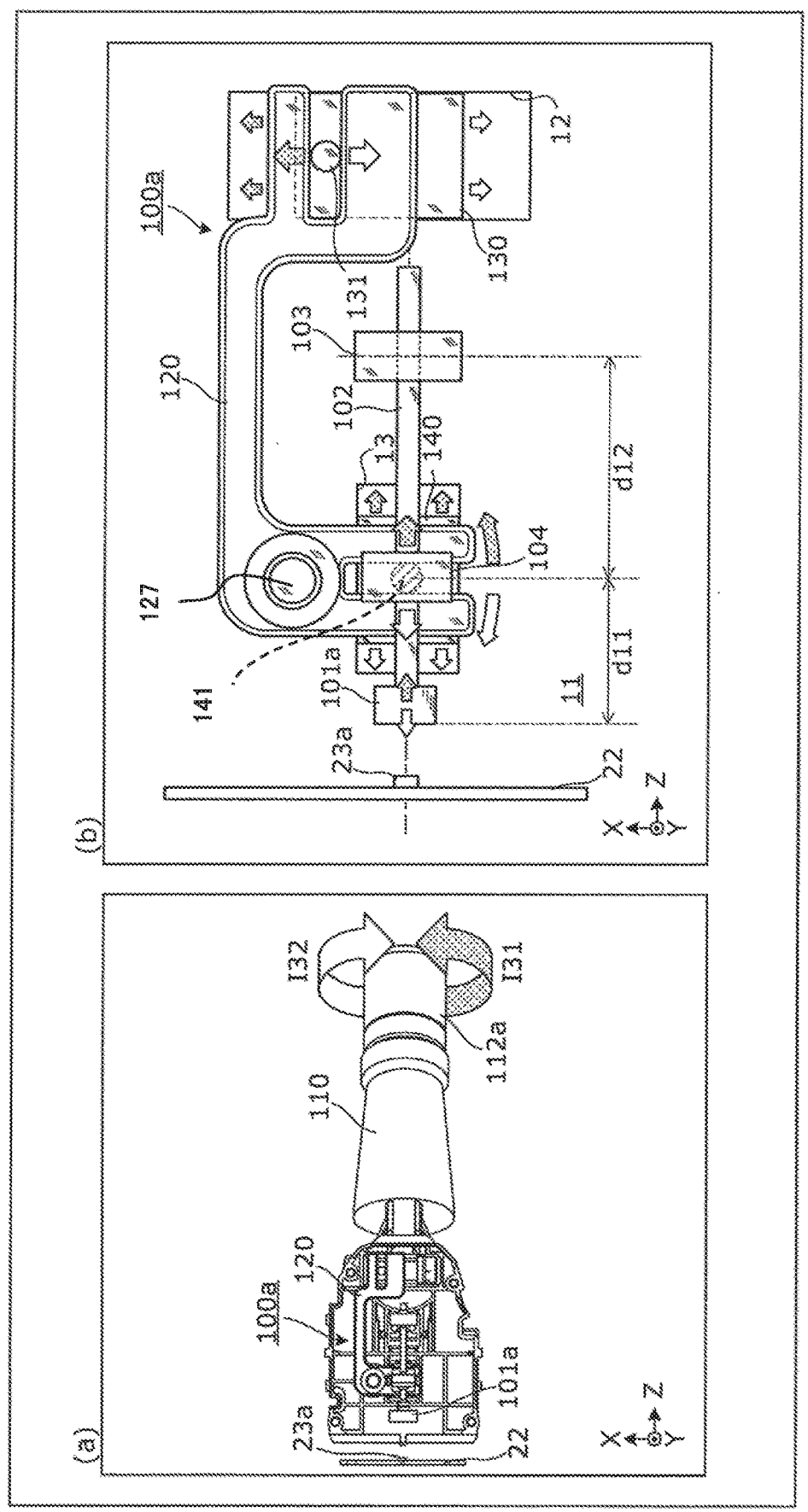
FIG. 26A is a view for explaining a relationship between a rotational operation and movement of the transmission mechanism.
Figure 26B:
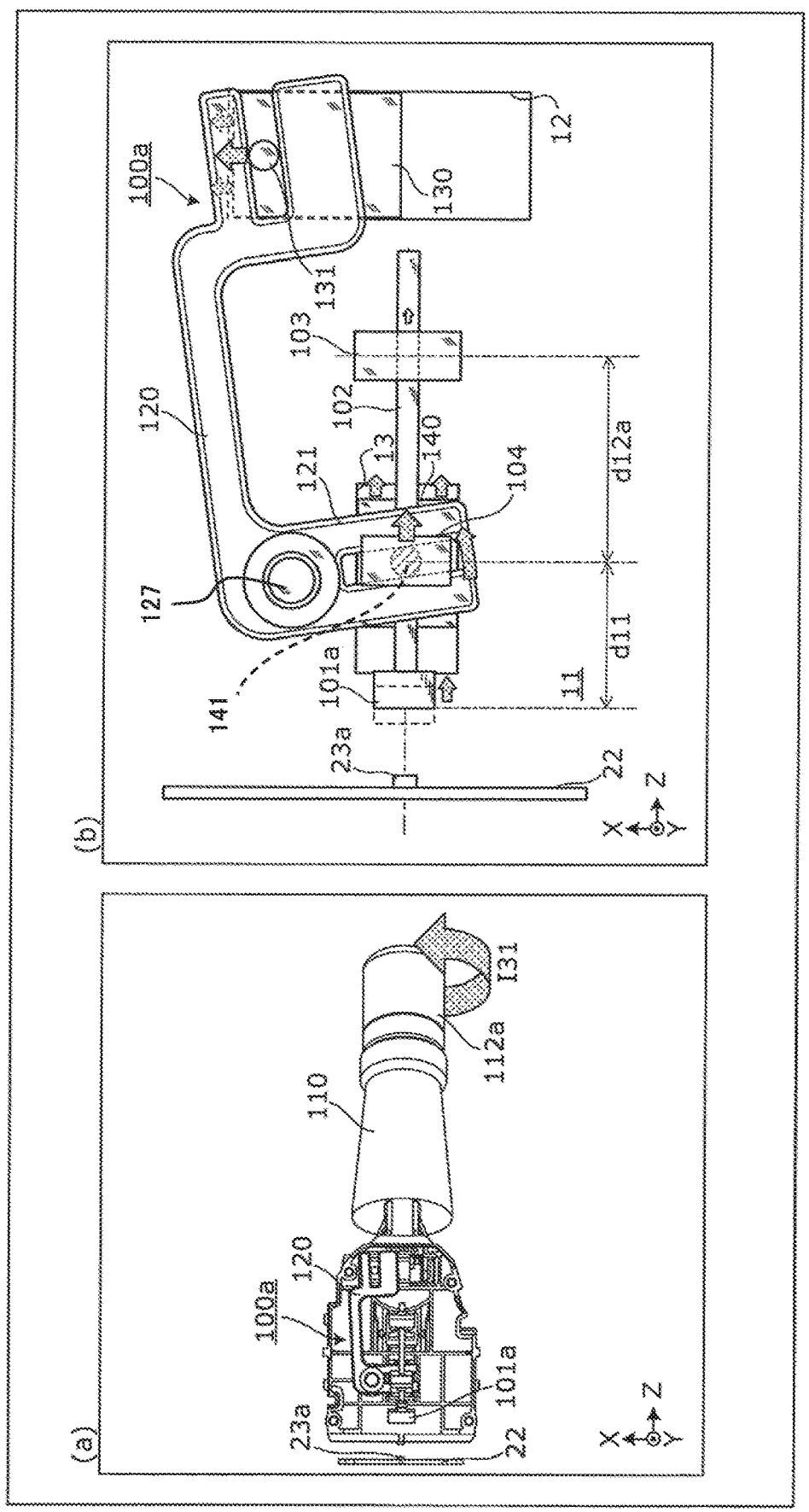
FIG. 26B is a view for explaining a relationship between the rotational operation and movement of the transmission mechanism.
Figure 26C:
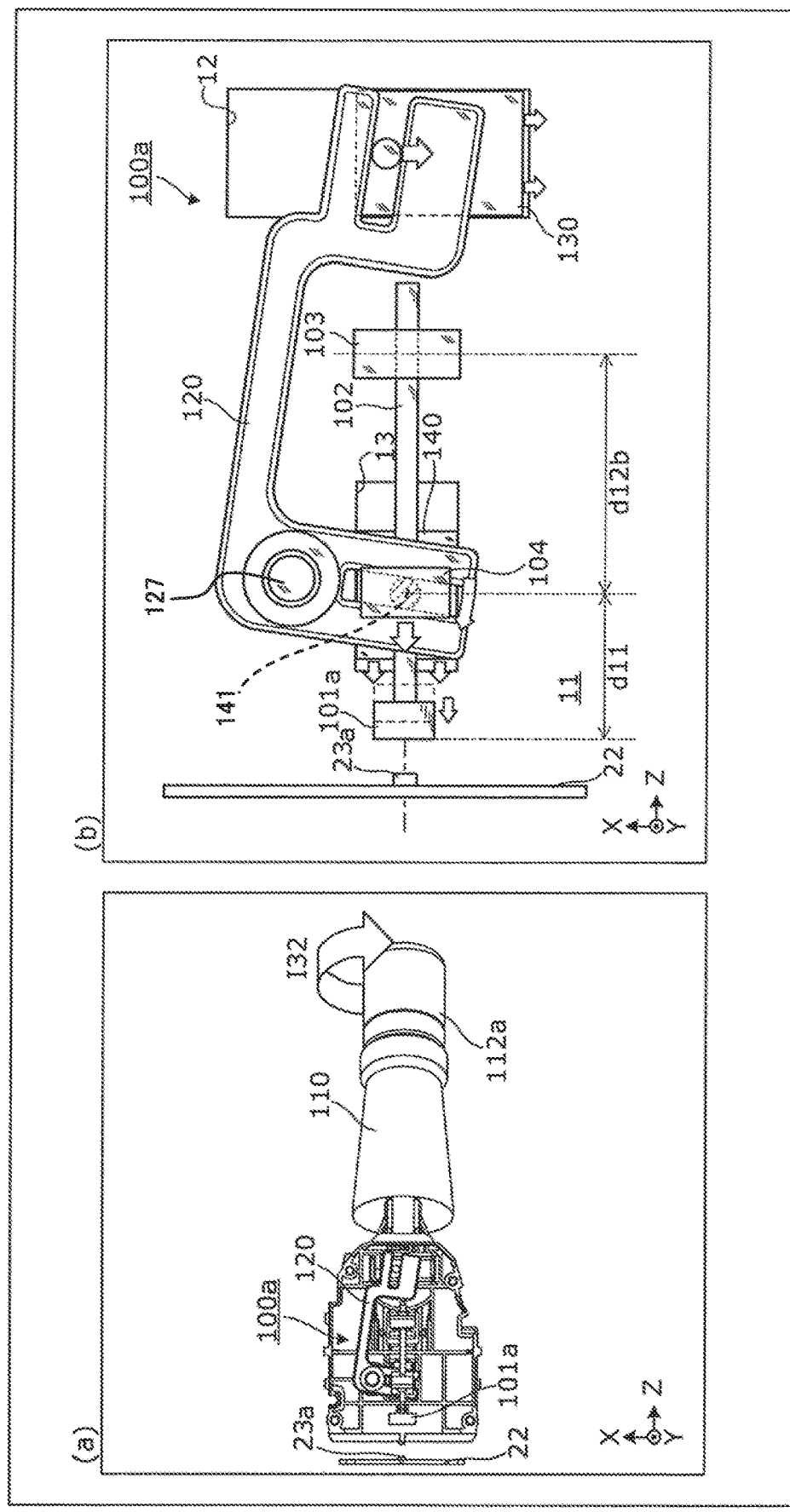
FIG. 26C is a view for explaining a relationship between the rotational operation and movement of the transmission mechanism.

FIGS. 26A to 26C are views for explaining a relationship between a rotational operation and movement of the transmission mechanism.

Herein, (a) of FIG. 26A is a view showing the state when the driver applies, to knob 112a of lever 110 (second lever member 112), input I31 or input I32 which rotates knob 112a about lever 110 as an axis. Further, (b) of FIG. 26A is a view for explaining movement of first transmission mechanism 100a when knob 112a of lever 110 shown in (a) of FIG. 26A is rotated. Furthermore, (b) of FIG. 26A is a plan view of first transmission mechanism 100a when viewed from above (positive side in Y-axial direction). Still further, FIG. 26B shows an example when input I31 is applied to knob 112a, and (a) and (b) of FIG. 26B are views corresponding to (a) and (b) of FIG. 26A, respectively. Still furthermore, FIG. 26C shows an example when input I32 is applied to knob 112a, and (a) and (b) of FIG. 26C are views corresponding to (a) and (b) of FIG. 26A, respectively.

When input I31 or input I32 is applied to knob 112a to rotate second lever member 112 with respect to first lever member 111 as shown in (a) of FIG. 26A, first sliding member 130 is slid in X-axial direction with respect to second case 11 as shown in (b) of FIG. 26A. When sliding in X-axial direction with respect to second case 11 by rotating second lever member 112, first sliding member 130 causes second rocking member 120 to rock about shaft body 127 as an axis. When rocking about shaft body 127 as an axis, second rocking member 120 can apply a force along Z-axial direction to projection part 141 of second sliding member 140, and move second supporting body 104 along Z-axial direction.

In this way, in the case where second supporting body 104 is moved along Z-axial direction, first rocking member 102 is applied with the force in Z-axial direction to spherical part 102b because first rocking member 102 is supported such that second supporting body 104 sandwiches spherical part 102b in Z-axial direction. In other words, second supporting body 104 receives a third input due to movement along the first direction (Z-axial direction).

At this time, since first supporting body 103 supports first rocking member 102 such that rod portion 102a of first rocking member 102 is slidable in Z axial direction with respect to spherical surface member 103C, first rocking member 102 slides in Z-axial direction. In other words, the third input causes first rocking member 102 to move along Z-axial direction and slide with respect to first supporting body 103, thereby moving first permanent magnet 101a along Z-axial direction. Thus, first permanent magnet 101a fixed to first rocking member 102 is moved along Z-axial direction.

Specifically, when the driver applies, to knob 112a, input I31 which rotates knob 112a clockwise viewed from the positive side in Z-axial direction as shown in (a) of FIG. 26B, first sliding member 130 slides toward the positive side in X-axial direction as shown in (b) of FIG. 26B. Thus, second rocking member 120 is rocked in a counter clockwise direction of the page, and moves second supporting body 104 to the positive side in Z-axial direction. Consequently, first rocking member 102 is moved to the positive side in Z-axial direction, and first permanent magnet 101a is moved to the positive side in Z-axial direction.

Note that, in this case, second supporting body 104 moves to the positive side in Z-axial direction but first supporting body 103 does not move. Therefore, second distance d12a between first supporting body 103 and second supporting body 104 is shorter than second distance d12. Even in this case, second distance d12a is longer than first distance d11.

Further, when the driver applies, to knob 112a, input I32 which rotates knob 112a counter clockwise viewed from the positive side in Z-axial direction as shown in (a) of FIG. 26C, first sliding member 130 is slid toward the negative side in X-axial direction as shown in (b) of FIG. 26C. Thus, second rocking member 120 is rocked in a clockwise direction of the page, and moves second supporting body 104 to the negative side in Z-axial direction. Consequently, first rocking member 102 is moved to the negative side in Z-axial direction, and first permanent magnet 101a is moved to the negative side in Z axial direction.

Note that, in this case, second supporting body 104 moves to the negative side in Z-axial direction but first supporting body 103 does not move. Therefore, second distance d12b between first supporting body 103 and second supporting body 104 is still longer than second distance d12.

As mentioned above, first transmission mechanism 100a carries out three different movements, i.e., the first rocking, the second rocking, and the movement in Z-axial direction, so that first permanent magnet 101a is moved in the three different directions. Note that, these movements may be carried out at the same time. In other words, among the movement of first permanent magnet 101a due to the first rocking, the movement of first permanent magnet 101 due to the second rocking, and the movement of first permanent magnet 101a due to the movement in Z-axial direction, two or more movements may be combined. Accordingly, among the movement of first permanent magnet 101a due to the first rocking, the movement of first permanent magnet 101 due to the second rocking, and the movement of first permanent magnet 101a due to the movement in Z-axial direction, even if two or more movements are combined, the movements have respective three different directions three-dimensionally. This makes it possible to assign each of three kinds of movements to any switching operation (e.g., turning on and off blinkers to any direction, turning on and off a headlight, turning on and off a high beam of a headlight, turning on and off a windshield wiper, adjusting speed of a windshield wiper) of each device.

According to the present exemplary embodiment, first permanent magnet 101a can be moved by an amount of displacement smaller than an amount of the displacement, due to displacement by rocking, inputted to first supporting body 103. Thus, a moving distance of first permanent magnet 101a can be reduced while first permanent magnet 101a is moved close to first magnetic sensor 23a, even if a position of the rocking axis of lever 110 is set within a predetermined range, for example. As a result, the moving distance of first permanent magnet 101a can be appropriately adjusted into the first detection area of first magnetic sensor 23a for detecting first permanent magnet 101a. Accordingly, first permanent magnet 101a can be detected with sufficient accuracy without, for example, employing a detecting unit with a huge detection area, or employing a plurality of detecting units. Therefore, the manufacturing cost can be reduced.

Further, for example, if an N-pole and an S-pole of first permanent magnet are arranged in a vertical direction (Z-axial direction) and first magnetic sensor also detects a positional relationship between the N-pole and the S-pole, first permanent magnet can be moved without changing the positional relationship between the N-pole and the S-pole each other, because one degree of freedom in movement of first supporting body is restricted.

Further, first permanent magnet 101a can be moved by an amount of displacement smaller than an amount of the inputted displacement with a simple structure.

Further, even if an input due to movement in different directions is applied, first permanent magnet 101a can be moved in the respective different directions, thereby being available for, for example, a detecting unit to switch operations of different devices.

Furthermore, first permanent magnet 101a can be easily moved in three different directions, thereby being available for, for example, a detecting unit to switch operations of three different devices by using one transmission mechanism. This makes it possible to simplify the structure.

Further, first permanent magnet 101a can be moved along an arc. This makes it relatively easy to calculate the coordinate value when first permanent magnet 101a is detected by first magnetic sensor 23a. Further, the movement of first permanent magnet 101a is achieved by moving the two members, i.e., first supporting body 103 and second supporting body 104. This makes it possible to relatively reduce stacked tolerance, which affects the moving distance of first permanent magnet 101a.

Furthermore, the connection of first case 21 and second case 11 makes it suitable to move permanent magnet 101 into first detection area S1 in which first magnetic sensor 23a is detectable. This eliminates necessity for wiring between first case 21 and second case 11, thereby making it possible to reduce the manufacturing cost.

(First Modification)

Next, a first modification in accordance with the third exemplary embodiment will be described with reference to FIG. 27.

Figure 27:
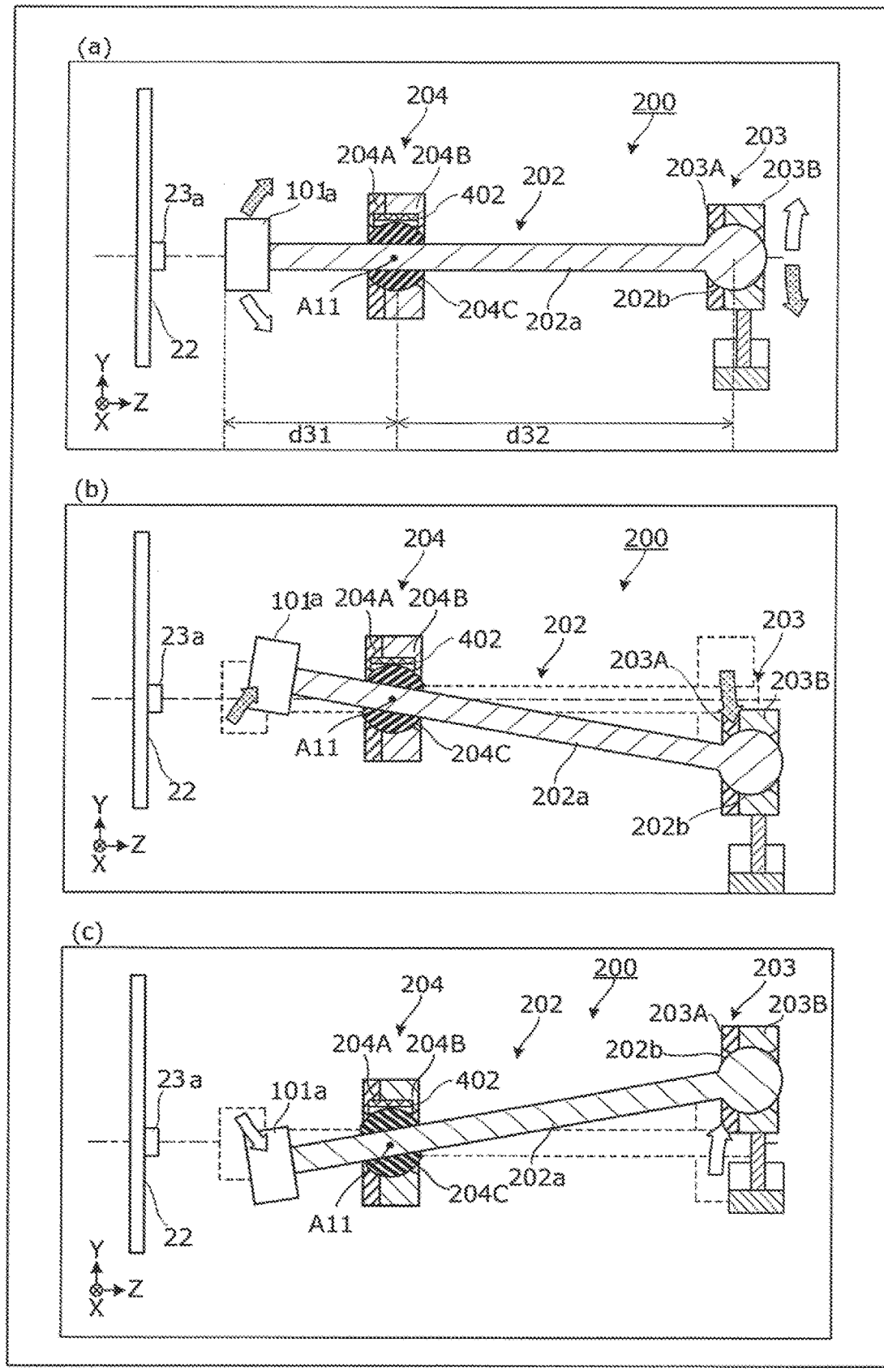
FIG. 27 is a view for explaining a transmission mechanism in accordance with a first modification of the third exemplary embodiment.

FIG. 27 is a view for explaining a transmission mechanism in accordance with the first modification of the third exemplary embodiment. Note that, in FIG. 27, first supporting body 203 is coupled with an end on the operating point side of lever 110, as shown in FIG. 22.

In first transmission mechanism 100a of the third exemplary embodiment, first rocking member 102 has spherical part 102b having a spherical shape whose diameter is larger than a width of rod portion 102a at a portion at which first rocking member 102 is supported by second supporting body 104, but is not limited to this. For instance, like first rocking member 202 of transmission mechanism 200 shown in FIG. 27, spherical part 202b having a spherical shape whose diameter is larger than a width of rod portion 202a may be provided at a portion at which rod portion 202a is supported by first supporting body 203. In this case, spherical part 202b is formed at an end on the positive side in Z-axial direction of rod portion 202a.

Further, first supporting body 203 spherically supports spherical part 202b of first rocking member 202, and has the same structure as second supporting body 104 of the third exemplary embodiment. In other words, first supporting body 203 has pressing member 203A and main support member 203B. Pressing member 203A and main support member 203B, mentioned above, have the same structures as the pressing member 104A and main support member 104B of the second supporting body 104 in the third exemplary embodiment 3, respectively. Therefore, description about a detailed structure of first supporting body 203 is omitted.

Further, second supporting body 204 has the same structure as first supporting body 103 of the third exemplary embodiment. In other words, second supporting body 204 has pressing member 204A, main support member 204B, and spherical surface member 204C. Pressing member 204A, main support member 204B, and spherical surface member 204C, which are mentioned above, have the same structures as pressing member 103A, main support member 103B, and spherical surface member 103C of first supporting body 103 in the third exemplary embodiment, respectively. Thus, description about a detailed structure of second supporting body 204 is omitted. As second supporting body 204 has the same structure as first supporting body 103 of the third exemplary embodiment, second supporting body 204 and first rocking member 202 are connected to be slidable and rockable in a direction in which rod portion 202a extends.

In this structure, when first supporting body 203 receives the input applied by the rocking of lever 110, first supporting body 203 is moved in a direction intersecting with the first direction (Z-axial direction). Specifically, first supporting body 203 is coupled with an end on the operating point side of lever 110, and is moved toward a direction in which lever 110 is turned about third axis A3 or fourth axis A4 as a fulcrum.

Further, second supporting body 204 serves as a rocking fulcrum of first rocking member 202 when first supporting body 203 is moved. Herein, first distance d31 between first permanent magnet 101a and second supporting body 204 is shorter than second distance d32 between first supporting body 203 and second supporting body 204. Accordingly, first rocking member 202 is rocked to cause first permanent magnet 101a to move by an amount of displacement smaller than an amount of the displacement inputted to first supporting body 203, like the third exemplary embodiment. Note that, although distance d31 and second distance d32 are varied by rocking, even if varied, transmission mechanism 200 is configured such that distance d31 and second distance d32 satisfy the relationship in which first distance d31 is shorter than second distance d32.

Specifically, as shown in (b) of FIG. 27, when first supporting body 203 is turned about third axis A3 as a fulcrum toward the negative side in Y-axial direction, first rocking member 202 slides toward the positive side in Z-axial direction while rocking about first axis A11 of second supporting body 204 as a fulcrum in a clockwise direction of the page, and moves first permanent magnet 101a along the positive side in Y-axial direction.

Further, as shown in (c) of FIG. 27, when first supporting body 203 is turned about third axis A3 as a fulcrum toward the positive side in Y-axial direction, first rocking member 202 slides toward the positive side in Z-axial direction while rocking about first axis A11 of second supporting body 204 as a fulcrum in a counter clockwise direction of the page, and moves first permanent magnet 101a along the negative side in Y-axial direction.

Furthermore, although not illustrated, if first supporting body 203 is moved to Z-axial direction, a mechanism for moving first supporting body 203 to Z-axial direction will be needed to achieve the above requirement.

By constructing transmission mechanism 200 described above, first permanent magnet 101a can be moved from one part of first supporting body 203 toward three different directions, thereby making it possible to reduce stacked tolerance which affects a moving distance of first permanent magnet 101a.

(Second Modification)

Next, a second modification of the third exemplary embodiment, mentioned above, will be described with reference to FIG. 28.

Figure 28:
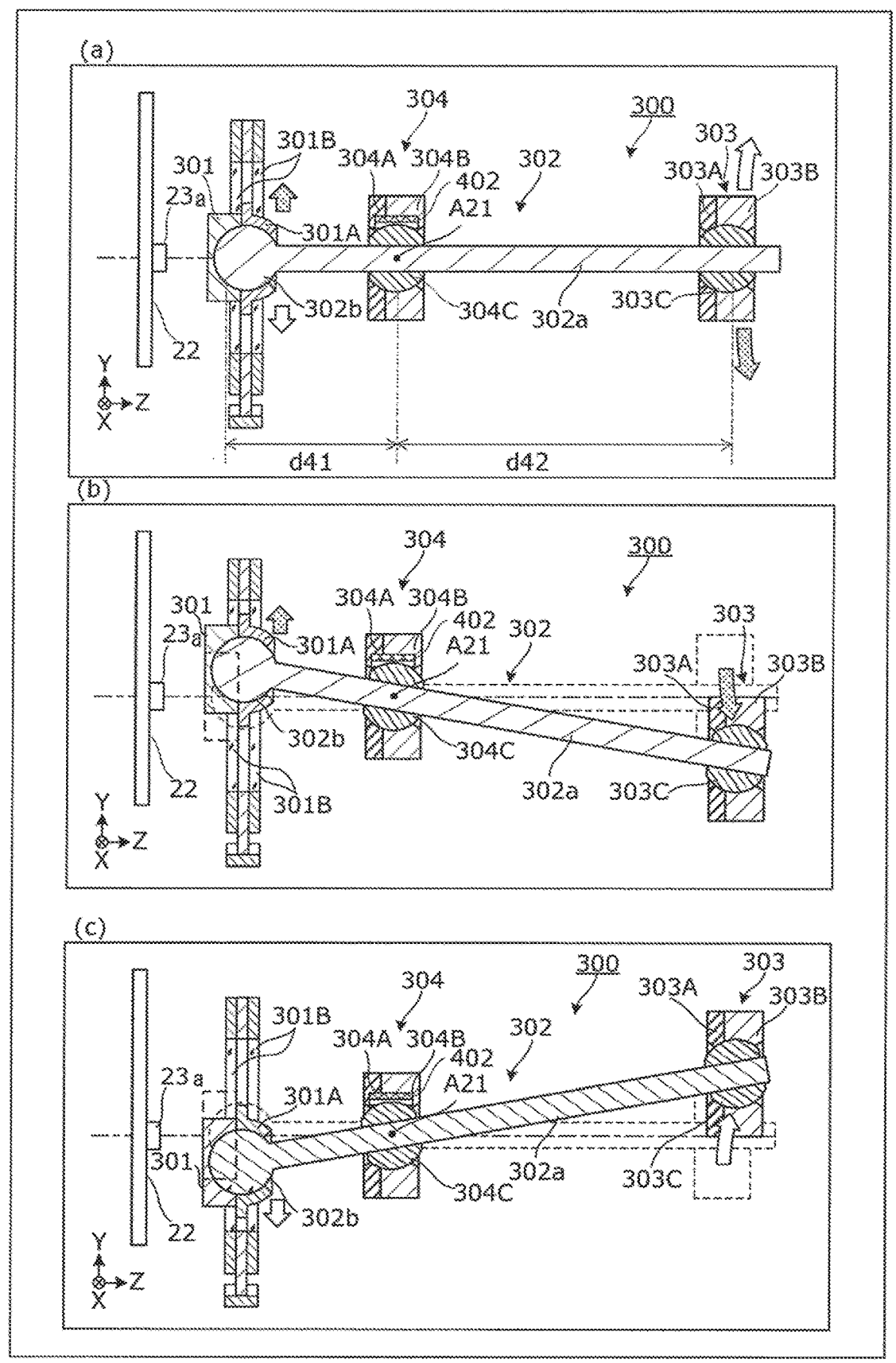
FIG. 28 is a view for explaining a transmission mechanism in accordance with a second modification of the third exemplary embodiment.

FIG. 28 is a view for explaining a transmission mechanism in accordance with the second modification of the third exemplary embodiment. Note that, in FIG. 28, first supporting body 303 is coupled with an end on the operating point side of lever 110, like in FIG. 22.

In first transmission mechanism 100a of the third exemplary embodiment, first rocking member 102 has spherical part 102b having a spherical shape whose diameter is larger than a width of rod portion 102a at a portion at which first rocking member 102 is supported by second supporting body 104, but is not limited to this. For instance, like first rocking member 302 of transmission mechanism 300 shown in FIG. 28, spherical part 302b having a spherical shape whose diameter is larger than a width of rod portion 302a may be provided at an end on the negative side in Z-axis direction of first rocking member 302.

Hereinafter, a concrete structure of transmission mechanism 300 will be described.

Unlike first transmission mechanism 100a of the third exemplary embodiment, transmission mechanism 300 further includes third supporting body 301A and guide member 301B. Third supporting body 301A spherically supports an end of first rocking member 302, and supports first permanent magnet 301 at a position corresponding to the end of first rocking member 302. Note that, in the embodiment of FIG. 28, third supporting body 301A spherically supports spherical part 302b together with first permanent magnet 301.

Guide member 301B moves third supporting body 301A along a plane intersecting with the first direction (Z-axial direction).

Further, although not illustrated, if third supporting body 301A is moved to Z-axial direction, a mechanism for moving third supporting body 301A to Z-axial direction will be needed to achieve the above requirement.

Furthermore, first supporting body 303 and second supporting body 304, which are included in transmission mechanism 300, have the same structure as first supporting body 103 of the third exemplary embodiment. In other words, first supporting body 303 and second supporting body 304 have pressing members 303A and 304A, main support members 303B and 304B, and spherical surface members 303C and 304C, respectively. Pressing members 303A and 304A, main support members 303B and 304B, and spherical surface members 303C and 304C have the same structures as pressing member 103A, main support member 103B, and spherical surface member 103C of first supporting body 103 in the third exemplary embodiment, respectively. Accordingly, description about detailed structures of first supporting body 303 and second supporting body 304 is omitted.

In this structure, upon receiving an input applied by the rocking of lever 110, first supporting body 303 is moved in a direction intersecting with the first direction (Z-axial direction). Specifically, first supporting body 303 is coupled with an end on the operating point side of lever 110, and is moved toward a direction in which lever 110 turns about third axis A3 or fourth axis A4 as a fulcrum. First supporting body 303 is slidably connected to rod portion 302a of first rocking member 302. Accordingly, even if first supporting body 303 is turned as mentioned above, an end on the positive side in Z-axial direction of first rocking member 302 is moved along Y-axial direction while an angle of first rocking member 302 is changed about spherical part 302b as a fulcrum.

Further, second supporting body 304 serves as a rocking fulcrum of first rocking member 302 when first supporting body 303 is moved. Furthermore, second supporting body 304 is fixed to second case 11 and slidably connected to rod portion 302a of first rocking member 302. Accordingly, when first supporting body 303 moves along Y-axial direction, spherical part 302b is moved along guide member 301B in a direction (i.e., X-axial direction, or Y-axial direction) orthogonal to Z-axial direction.

Note that, since first distance d41 between first permanent magnet 301 and second supporting body 304 is shorter than second distance d42 between first supporting body 303 and second supporting body 304, first rocking member 302 is rocked to cause first permanent magnet 301 to move by an amount of displacement smaller than an amount of the displacement inputted to first supporting body 303, like the third exemplary embodiment. Note that, although distance d42 is varied by rocking, even if varied, transmission mechanism 300 is configured to satisfy the relationship that first distance d41 is shorter than second distance d42.

Specifically, as shown in (b) of FIG. 28, when first supporting body 303 turns about third axis A3 as a fulcrum toward the negative side in Y-axial direction, first rocking member 302 is rocked about first axis A21 of second supporting body 304 as a fulcrum in a clockwise direction of the page. At this time, spherical part 302b, i.e., the end on the negative side in Z-axial direction of first rocking member 302 is supported by third supporting body 301A and is guided by guide member 301B such that spherical part 302b is moved in a direction orthogonal to Z-axial direction. Thus, first permanent magnet 301 is moved to the positive side in Y-axial direction.

Further, as shown in (c) of FIG. 28, when first supporting body 303 turns about third axis A3 as a fulcrum toward the positive side in Y-axial direction, first rocking member 302 is rocked about first axis A21 of second supporting body 304 as a fulcrum in a counter clockwise direction of the page. At this time, spherical part 302b, i.e., the end on the negative side in Z-axial direction of first rocking member 302 is supported by the third supporting body 301A and is guided by guide member 301B such that spherical part 302b is moved in a direction orthogonal to Z-axial direction. Thus, first permanent magnet 301 is moved to the negative side in Y-axial direction.

Further, although not illustrated, if first permanent magnet 301 is moved to Z-axial direction, guide member 302B will be needed to move in Z-axial direction to achieve the above requirement.

By constructing transmission mechanism 300 described above, first permanent magnet 301 can be moved on a plane perpendicular to Z-axial direction. This makes it easy to calculate the coordinate value when first permanent magnet 301 is detected by first magnetic sensor 23a.

Other Exemplary Embodiment

According to the above-mentioned exemplary embodiments, the transmission mechanism moves the permanent magnet, which serves as an object to be moved, along three different directions, i.e., X-axial direction, Y-axial direction, and Z-axial direction, but is not limited to this. The permanent magnet may be moved in at least one direction. In this case, rocking in only one axial direction among two axial directions, or movement along Z-axial direction may be employed.

Further, according to the above-mentioned exemplary embodiments, the mechanism for rocking second rocking member 120 by rotating knob 112a of lever 110 is employed, but the present disclosure is not limited to this. A mechanism for rocking second rocking member 120 by using the third rocking or the fourth rocking of lever 110 may be employed. Furthermore, a mechanism for causing first rocking member 102 to perform the first rocking or the second rocking by turning knob 112a of lever 110 may be employed.

Still further, the above-mentioned exemplary embodiment has such a configuration that second permanent magnet 101b is moved by rocking second transmission mechanism 100b, but this configuration may be eliminated.

As mentioned above, the transmission mechanism, the lever mechanism, and the non-contact lever switch in accordance with one or more aspects of the present disclosure has been described based on the exemplary embodiments, but the present disclosure is not limited to the exemplary embodiments. Various modifications to these embodiments which may be conceived by those skilled in the art, as well as embodiments resulting from combinations of some of the structural elements of this embodiment are to be included within one or more aspects of the present disclosure, as long as such modifications and embodiments do not depart from the essence of the present disclosure.

For instance, the transmission mechanism may include an object to be moved, a first rod-shaped rocking member having an end disposed with the object to be moved and extending in a first direction, and two supporting bodies rockably supporting the first rocking member at two different positions in the first direction of the first rocking member. Thus, the first rocking member is rocked to cause the object to be moved to move by an amount of displacement smaller than an amount of the displacement inputted to a first supporting body that is one of the two supporting bodies and located on the other end side of the first rocking member.

According to this, the first rocking member can be rocked to cause the object to be moved to move by an amount of displacement smaller than an amount of the displacement inputted to the first supporting body. Thus, even if a position of a rocking axis of a lever is set within a predetermined range, for example, a moving amount of the object to be moved can be reduced after the object to be moved has been moved close to a detecting unit. As a result, the moving amount of the object to be moved can appropriately be adjusted within a detection area at which the detecting unit can detect the object to be moved. Accordingly, the object to be moved can be detected with sufficient accuracy without, for example, employing a detecting unit with a huge detection area, or employing a plurality of detecting units. Therefore, the manufacturing cost can be reduced.

Further, upon receiving an input, the first supporting body may be moved in a direction intersecting with the first direction. A second supporting body, which is one of the above-mentioned two supporting bodies and disposed closer to the one end side of the first rocking member than the first supporting body is, may serve as a rocking fulcrum of the first rocking member when the first supporting body is moved. A first distance between the one end of the first rocking member and the second supporting body may be shorter than the second distance between the first supporting body and the second supporting body.

Thus, the object to be moved can be moved by an amount of displacement smaller than an amount of the inputted displacement with a simple structure.

Further, the second supporting body may rockably support the first rocking member through at least two axes whose directions are different from each other.

This makes it possible to move the object to be moved in a corresponding one of the different directions, even if an input due to movement in different directions is received, thereby being available for, for example, a detecting unit to switch operations of different devices.

Further, the first supporting body may receive a first input due to movement in a second direction intersecting with the first direction and a second input due to movement in a third direction intersecting with the first direction and the second direction. Upon receiving the first input, the first rocking member is rocked about a first axis, which is one of the two axes, as a fulcrum in the second supporting body, thereby moving the object to be moved along the second direction different from the first direction, and receives the second input whose direction is different from that of the first input and is rocked about a second axis different from the first axis, which is the other of the two axes, as a fulcrum in the first supporting body. Thus, the object to be moved may be moved in the third direction different from the first direction and the second direction.

Further, one of the first supporting body and the second supporting body may receive a third input due to movement along the first direction and cause the first rocking member to move along the first direction due to the third input. In addition to this, the one of the first supporting body and the second supporting body may be slid with respect to the other of the first supporting body and the second supporting body, thus cause the object to be moved to move along the first direction.

Accordingly, the object to be moved can easily be moved in three different directions, thereby being available for, for example, a detecting unit to switch operations of three different devices by using one transmission mechanism. This makes it possible to simplify the structure.

Further, the first rocking member may be spherically supported by the second supporting body, and the second supporting body may be moved in the first direction upon receiving the third input, thereby moving the first rocking member along the first direction. The first supporting body and the first rocking member may be connected to be slidable and rockable in the first direction.

Thus, the object to be moved can be moved along an arc. This makes it relatively easy to calculate the coordinate value when the object to be moved is detected by a first magnetic sensor. Further, movement of the object to be moved is achieved by moving two members, i.e., the first supporting body and the second supporting body. This makes it possible to relatively reduce stacked tolerance which affects a moving distance of the object to be moved.

Further, the first rocking member may be spherically supported by the first supporting body. The first supporting body may be move in the first direction upon receiving the third input, thereby moving the first rocking member along the first direction. The second supporting body and the first rocking member may be connected to be slidable and rockable in the first direction.

Thus, the object to be moved can be moved from one part of first supporting body toward three different directions, thereby making it possible to reduce stacked tolerance which affects a moving distance of the object to be moved.

Furthermore, the transmission mechanism may include a third supporting body that spherically supports an end of the first rocking member and supports the object to be moved at a position corresponding to the end of the first rocking member, and a guide member that performs at least one of the movements, i.e., moves the third supporting body along a plane intersecting with the first direction and/or moves the first rocking member along the first direction by the movement along the first direction upon receiving the third input along the first direction. In addition to this, each of the first supporting body and the second supporting body may be connected with the first rocking member so as to be slidable in the first direction. The first rocking member may be moved along the first direction upon receiving the third input, and slid with respect to the first supporting body and the second supporting body, thereby moving the object to be moved along the first direction.

According to this, the object to be moved can be moved along a plane intersecting with the first direction. This makes it easy to calculate the coordinate value when the object to be moved is detected by the first magnetic sensor.

Further, the lever mechanism may include a first transmission mechanism serving as a transmission mechanism, and a lever that is rockably supported and gives a displacement to the first supporting body according to movement of a handle.

Thus, the rocking of the lever makes it easy to move the object to be moved.

Further, the lever mechanism may include a first transmission mechanism serving as a transmission mechanism, and a lever that is rockably supported by two axes whose directions are different from each other and gives a displacement to the first supporting body according to movement of a handle. The lever may give the first input to the first transmission mechanism by rocking about a third axis, which is one of the two axes, as a fulcrum, and give the second input to the first transmission mechanism by rocking about a fourth axis, which is the other of the two axes, as a fulcrum.

Thus, the rocking of the lever makes it easy to move the object to be moved in two different directions.

Further, the lever may have a first lever member rockably supported, and a second lever member that has at least one part disposed inside or outside the first lever member, is turnable about an axis parallel to an extending direction of the lever as a turning axis with respect to the first lever member, and extends to the extending direction. The lever mechanism may further include a second rocking member that receives turn of the second lever member and is rocked to give the third input due to movement in the first direction to the first rocking member.

Thus, the rocking and the turn of the lever makes it easy to move the object to be moved in three different directions.

Further, the non-contact lever switch may include a first case that accommodates the first magnetic sensor, a lever mechanism, and a second case that accommodates a portion at which the lever is supported and the first transmission mechanism and is connected to a predetermined position on the outside of the first case. Herein, the object to be moved and included in the first transmission mechanism is a first permanent magnet. The first magnetic sensor is disposed in the following manner, i.e., a direction and a position of the first magnetic sensor is determined such that a first detection area of the first magnetic sensor is arranged on a predetermined position side of the first case. The first transmission mechanism causes the first permanent magnet to move into the first detection area upon receiving the rocking from the lever in the state where the first case and second case are connected.

Thus, the connection of the first case and second case makes it possible to move the permanent magnet into a suitable detection area at which the magnetic sensor can detect the permanent magnet. This eliminates necessity for wiring between the first case and the second case, thereby making it possible to reduce the manufacturing cost.

Furthermore, the non-contact lever switch may further include a controller. The controller is configured to specify a three-dimensional position of the first permanent magnet in the first detection area based on the detection result of the first magnetic sensor, and to switch operations of a device according to the specified three-dimensional position.

Further, the non-contact lever switch may further include a second magnetic sensor different from the first magnetic sensor, a second permanent magnet different from the first permanent magnet, and a second transmission mechanism that is different from the first transmission mechanism and has an end opposite to the lever and disposed with the second permanent magnet. Furthermore, the lever may have a third lever member that is disposed inside or outside the first lever member, turnable about an axis parallel to the extending direction as a rotating axis with respect to the first lever member and the second lever member, and extends to the extending direction. The third lever member may turn about the axis with respect to the first lever member. The first case may further accommodate the second magnetic sensor whose direction and position are determined such that a second detection area of the second magnetic sensor is arranged on a predetermined position side of the first case. The second case may further accommodate the second permanent magnet and the second transmission mechanism. The second transmission mechanism may cause the second permanent magnet to move within the second detection area upon receiving turn of the third lever member in the state where the first case and the second case are connected.

Further, the non-contact lever switch may further include a controller. The controller is configured to specify a three-dimensional position of the first permanent magnet in the first detection area based on the detection result of the first magnetic sensor, to specify a three-dimensional position of the second permanent magnet in the second detection area based on the detection result of the second magnetic sensor, and to switch operations of a device according to the respective specified three-dimensional positions of the first permanent magnet and the second permanent magnet.

The present disclosure can be used for a spherical bearing device, a joint device, or the like which has a high degree of freedom in movement of a shaft member with respect to a bearing.

What is claimed is:

1. A spherical bearing device comprising:
 a shaft member that has a spherical body having a first engaging portion, and a shaft body disposed with a first axis passing through a center of the spherical body;
 a turnable body having a second engaging portion engaged with the first engaging portion in a first rotational direction about the first axis, and allows the first engaging portion to rotate in a second rotational direction about a second axis intersecting with the first axis at the center of the spherical body; and
 a bearing that is provided with a first space and a second space, holds the shaft member so as to be spherically slidable, and allows the shaft body to move as the spherical body spherically slides,
 wherein the first space accommodates the spherical body such that the spherical body is spherically slidable about the center of the spherical body, and
 the second space accommodates the turnable body of which the second engaging portion is engaged with the first engaging portion of the spherical body such that the turnable body is turnable about a third axis intersecting with the first axis and the second axis at the center of the spherical body.

2. The spherical bearing device according to claim 1, wherein
 the first engaging portion is formed such that a surface of the spherical body is partially cut out, and
 the second engaging portion is formed such that a surface of the turnable body is partially cut out.

3. The spherical bearing device according to claim 1, wherein the first engaging portion is a projection part provided on a surface of the spherical body, and the second engaging portion is a depression part provided in a surface of the turnable body.

4. The spherical bearing device according to claim 1, wherein the first engaging portion is a depression part provided in a surface of the spherical body, and the second engaging portion is a projection part provided on a surface of the turnable body.

5. The spherical bearing device according to claim 1, wherein the shaft body includes a bending portion.

6. A switch comprising:

the spherical bearing device as defined in claim 1; and a sensor that includes a first component provided to the shaft member of the spherical bearing device and a second component provided to the bearing of the spherical bearing device, and outputs an operation signal corresponding to a positional relationship between the first component and the second component.

* * * * *